US007078444B2

(12) United States Patent
Lamanna et al.

(10) Patent No.: US 7,078,444 B2
(45) Date of Patent: Jul. 18, 2006

(54) IONIC PHOTOACID GENERATORS WITH SEGMENTED HYDROCARBONFLUOROCARBON SULFONATE ANIONS

(75) Inventors: William M. Lamanna, Stillwater, MN (US); Gregory D. Clark, Saint Paul, MN (US); Richard M. Flynn, Mahtomedi, MN (US); Zai-Ming Qiu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 4 days.

(21) Appl. No.: 11/029,975

(22) Filed: Jan. 5, 2005

(65) Prior Publication Data

US 2005/0158655 A1 Jul. 21, 2005

Related U.S. Application Data

(62) Division of application No. 10/286,330, filed on Nov. 1, 2002, now Pat. No. 6,841,333.

(51) Int. Cl.
*C08G 59/68* (2006.01)
*G03F 7/004* (2006.01)
*C07F 17/02* (2006.01)
*C07F 15/02* (2006.01)

(52) U.S. Cl. .................. 522/25; 522/15; 522/184; 430/270.1; 430/280.1; 430/326; 430/914; 430/921; 562/30; 558/44; 556/139; 556/143

(58) Field of Classification Search .................. 568/28, 568/579; 570/123
See application file for complete search history.

(56) References Cited

U.S. PATENT DOCUMENTS

| 2,732,398 | A | 1/1956 | Brice et al. |
| 3,708,296 | A | 1/1973 | Schlesinger |
| 4,058,400 | A | 11/1977 | Crivello |
| 4,069,055 | A | 1/1978 | Crivello |
| 4,216,288 | A | 8/1980 | Crivello |
| 4,250,311 | A | 2/1981 | Crivello |
| 4,264,703 | A | 4/1981 | Crivello |
| 4,304,705 | A | 12/1981 | Heilmann et al. |
| 4,329,478 | A | 5/1982 | Behr |
| 4,340,716 | A | 7/1982 | Hata et al. |
| 4,423,197 | A | 12/1983 | Behr |
| 4,503,211 | A | 3/1985 | Robins |
| 4,677,137 | A | 6/1987 | Bany et al. |
| 4,868,288 | A | 9/1989 | Meier |
| 4,920,182 | A | 4/1990 | Manser et al. |
| 4,933,377 | A | 6/1990 | Saeva et al. |
| 4,957,946 | A | 9/1990 | Meier et al. |
| 4,985,340 | A | 1/1991 | Palazzotto et al. |
| 5,073,476 | A | 12/1991 | Meier et al. |
| 5,084,586 | A | 1/1992 | Farooq |
| 5,089,536 | A | 2/1992 | Palazzotto |
| 5,124,417 | A | 6/1992 | Farooq |
| 5,143,785 | A | 9/1992 | Pujol et al. |
| 5,215,860 | A | 6/1993 | McCormick et al. |
| 5,554,664 | A | 9/1996 | Lamanna et al. |
| 5,569,784 | A | 10/1996 | Watanabe et al. |
| 5,624,787 | A | 4/1997 | Watanabe et al. |
| 5,627,292 | A * | 5/1997 | Armand et al. ............. 549/555 |
| 5,688,884 | A | 11/1997 | Baker et al. |
| 5,731,364 | A | 3/1998 | Sinta et al. |
| 6,358,665 | B1 | 3/2002 | Pawlowski et al. |
| 6,506,535 | B1 | 1/2003 | Mizutani et al. |
| 2002/0102491 | A1 | 8/2002 | Kodama et al. |
| 2002/0197558 | A1 | 12/2002 | Ferreira et al. |
| 2003/0027061 | A1 | 2/2003 | Cameron et al. |
| 2003/0113658 | A1 | 6/2003 | Ebata et al. |

FOREIGN PATENT DOCUMENTS

| CA | 1300307 | 5/1992 |
| DD | 295 421 A5 | 10/1991 |
| EP | 0 094914 B1 | 11/1983 |
| EP | 1 033 624 A1 | 9/2000 |
| WO | WO 02/082185 A1 | 10/2002 |

OTHER PUBLICATIONS

J. V. Crivello et al., "Epoxidized Triglycerides as Renewable Monomers in Photoinitiated Cationic Polymerization", Chemistry of Materials (A Publication of the American Chemical Society), (Jun. 1992), pp. 692-699, vol. 4, No. 3.
Encyclopedia of Polymer Science and Engineering, "Cationic Polymerization", (1985), pp. 730-814, vol. 2, John Wiley & Sons, New York.
Lee and Neville, Handbook of Epoxy Resins, (1967), McGraw-Hill, Inc., New York.
P. F. Bruins, Epoxy Resin Technology, (1968), John Wiley & Sons, Inc., New York.
G. Odian, Principles of Polymerization, (1991), 3$^{rd}$ Edition, John Wiley & Sons, Inc., New York.
H. Ito et al, "Applications of Photoinitiators to the Design of Resists for Semiconductor Manufacturing", Polymers in Electronics, ACS Symposium Series 242, (1984), pp. 11-23, American Chemical Society, Washington, D.C.
K. Dietliker, "Chapter V, UV Curable Screen Inks", Chemistry & Technology of UV & EB Formulation for Coatings, Inks & Paints, (1991), pp. 431-480, vol. III, Photoinitiators for Free Radical and Cationic Polymerisation, SITA Technology Ltd, London, England.
K. Dietliker, "Chapter VI, Inks and Resists for PCB's", Chemistry & Technology of UV & EB Formulation for Coatings, Inks & Paints, (1991), pp. 483-548, vol. III, Photoinitiators for Free Radical and Cationic Polymerisation, SITA Technology Ltd, London, England.

* cited by examiner

Primary Examiner—Rosemary Ashton
(74) Attorney, Agent, or Firm—Kent S. Kokko

(57) ABSTRACT

Photoacid generator salts comprising photoactive cationic moieties and segmented, highly fluorinated-hydrocarbon anionic moieties are disclosed which provide high photoacid strength and can be tailored for solubility and polarity. The present invention further relates to photoacid generators as they are used in photoinitiated acid-catalyzed processes for uses such as photoresists for microlithography and photopolymerization.

34 Claims, No Drawings

IONIC PHOTOACID GENERATORS WITH SEGMENTED HYDROCARBONFLUOROCARBON SULFONATE ANIONS

This application is a divisional of application Ser. No. 10/286,330 filed Nov. 1, 2002, now U.S. Pat. No. 6,841,333, the disclosure of which is herein incorporated by reference.

FIELD OF THE INVENTION

The invention relates to ionic photoacid generators (PAGs). The invention further relates to photosensitive compositions containing these ionic photoacid generators and methods of making photosensitive compositions thereof.

BACKGROUND OF THE INVENTION

Ionic photoacid generators comprising an organic onium or organometallic cation and a non-nucleophilic counter anion have been shown to have utility as photochemically activated initiators for cationic addition polymerization in negative resists and polymer coating formulations or as similarly activatable latent acid catalysts for step-growth (or condensation) polymerization, depolymerization and the deprotection of functionalized polymers used in positive, chemically amplified photoresists. Common commercial ionic PAGs include onium and organometallic salts such as diaryliodonium and triarylsulfonium salts and (cyclopentadienyl)(arene)iron$^+$ salts of the anions $PF_6^-$, $SbF_6^-$, $CF_3SO_3^-$, $C_4F_9SO_3^-$ and $C_8F_{17}SO_3^-$. In certain cases, these same salts may also photoinitiate free-radical addition polymerization and are useful in "dual cure" applications where a mixture of cationically sensitive and free-radically polymerizable monomers are polymerized either simultaneously or sequentially. Similarly, certain classes of these salts are known to be thermally-activatable curatives for cationic, step-growth and free-radical polymerizations.

The migration of semiconductor manufacturing to ever smaller feature sizes is pushing the limits of optical lithography and increasing the need for new photoresist materials that can meet the demands of more advanced lithography platforms. A critical component of photoresist formulations is the photo-acid generator or PAG. PAGs are the photoactive ingredients in photoresists that produce acid upon irradiation. In a positive resist this photoacid generally serves to catalyze deprotection of the polymeric resist, thereby altering its solubility in a developer. In a negative resist the photoacid typically initiates cationic polymerization or curing of monomeric groups, resulting in crosslinking of the resin in the irradiated areas. In both cases this process is referred to as chemical amplification, since a single photon is responsible for catalyzing or initiating multiple chemical events. Most of the PAGs currently used in semiconductor microlithography are ionic in nature, comprising a photoactive cation and a negatively charged counterion.

Organic onium salts, especially those containing iodonium and sulfonium, cations, are particularly useful as PAGs in chemically amplified photoresist applications owing to their high quantum efficiency for acid production at commonly used exposure wavelengths. In positive photoresists used in semiconductor microlithography, a number of other features and functional properties have been identified as being critical to PAG performance. These include: 1) compositions that are free of metallic or semimetallic elements (i.e., dopant elements) that can alter the electronic properties of the semiconducting substrate (e.g., silicon), 2) high photoacid strength, 3) low photoacid volatility, 4) small photoacid diffusion length, 5) solubility, and 6) thermal stability.

More recently, the toxicity, environmental persistence and bioaccumulation characteristics of PAG compositions has become an important consideration in determining their commercial viability. For ionic PAGs, all of these features and properties are determined or influenced by the chemical structure of the PAG anion. The structure of the anion directly determines the identity of the photo-acid produced upon irradiation of the PAG. Differences in the size, shape, and chemical makeup of the anion, X$^-$, can lead to dramatic differences in the acidity, catalytic activity, volatility, diffusivity, solubility, and stability of the conjugate photo-acid, HX. These can in turn directly influence a variety of parameters related to photoresist performance, such as deblocking (or curing) efficiency, photospeed, post exposure bake (PEB) sensitivity, post-exposure delay stability, resolution, standing waves, image profiles, and acid loss (responsible for T-topping and the contamination/corrosion of exposure and processing equipment). There are currently very few PAG anions that provide both the requisite balance of properties as well as an acceptable EHS+R (environmental, health, safety and regulatory) profile for use in semiconductor photoresists. Consequently, the selection of ionic PAGs for semiconductor photoresist applications has become anion limited and there exists a pressing need within the industry for a greater selection of semiconductor-compatible PAG anions that offer desirable photoresist performance, along with safety and environmental sustainability.

Ionic PAGs have additional utility in the preparation of polymer coatings, sealants, encapsulants, and the like derived from cationically polymerizable monomers and oligomers. For many commercial applications, the polymerizable monomers are multifunctional (i.e., contain more than one polymerizable group per molecule), for example, epoxides, such as diglycidyl ethers of bisphenol A (DGEBA) and vinyl ethers, such as 1,4-cyclohexanedimethanol divinyl ether (CHVE). Mixtures of multifunctional monomers such as polyisocyanates and polyalcohols (polyols) or polyepoxides and polyalcohols can undergo acid-catalyzed polycondensation via a step-growth mechanism. Also included in this description are multireactive monomers—those that comprise two or more classes of reactive groups, such as, for instance, a monomer comprising both acrylate and isocyanate functionalites.

Compounds and materials comprising charged ions (i.e., salts) tend to have poor solubility in many organic solvents. As many useful types of compositions are based on organic systems, either organic polymer systems or organic monomer systems, reduced solubility in organic systems limits the field of utility of many ionic materials. Amongst the ionic materials that could benefit from increased solubility in organic systems are ionic PAGs (particularly those based on iodonium, sulfonium, diazonium, phosphonium and organometallic complex cations).

Synthetic modifications of the cationic portion of cationic initiators have been made to improve their solubility in organic systems. However, the difficulty and cost of introducing solubilizing substituents has limited commercial application of these materials. Alternatively, the use of reactive diluents or solid dispersants has also been disclosed.

The nature of the counteranion in a complex salt can influence the rate and extent of cationic addition polymerization. For example, J. V. Crivello, and R. Narayan, *Chem.*

Mater., 4, 692, (1992), report that the order of reactivity among commonly used nonnucleophilic anions is $SbF_6^- > AsF_6^- > PF_6^- > BF_4^-$. The influence of the anion on reactivity has been ascribed to three principle factors: (1) the acidity of the protonic or Lewis acid generated, (2) the degree of ion-pair separation in the propagating cationic chain and (3) the susceptibility of the anions to fluoride abstraction and consequent chain termination.

U.S. Pat. Nos. 4,920,182 and 4,957,946 describe energy-polymerizable compositions comprising arene-iron salts of, e.g., fluoroalkylsulfonic acid (fluoroalkylsulfonates). U.S. Pat. No. 5,089,536 describes energy-polymerizable compositions comprising organometallic salts as initiators. Numerous anions are disclosed as being suitable counterions for the organometallic cations disclosed therein.

Patents DD 295,421 and U.S. Pat. No. 6,358,665 disclose ionic photoacid generators comprising I- and S-centered onium cations and organic sulfonate anions with various degrees of fluorination of the organic group.

U.S. Pat. No. 5,554,664 describes energy activatable salts comprising methides and imideperfluorinated anions.

U.S. Pat. No. 4,423,197 claims latent catalyst salts containing perfluorinated sulfonamide anions derived from cyclic disulfonic acid anhydrides that are heat activated.

The broad class of cationic photoactive groups recognized in the catalyst and photoinitiator industries may be used in the practice of the present invention. Photoactive cationic nuclei, photoactive cationic moieties, and photoactive cationic organic compounds are art recognized classes of materials as exemplified by U.S. Pat. Nos. 4,250,311; 3,708,296; 4,069,055; 4,216,288; 5,084,586; 5,124,417; 4,985,340 and 5,089,536.

SUMMARY OF THE INVENTION

In one aspect of the present invention, ionic photoacid generators are provided having (1) a photoactive cation comprising at least one of (i) a transition metal containing organometallic cation, (ii) an organic onium cation, such as an iodonium or sulfonium cation, or (iii) a mixture thereof, and (2) a segmented hydrocarbon-fluorocarbon-sulfonate anion of the formula (I):

where:

$R_f$ is a highly fluorinated divalent alkylene moiety, preferably having 1 to 12 catenary carbon atoms, most preferably having 2 to 7 carbon atoms, Q=a covalent bond, divalent linking group or a trivalent linking group, $R_h$ is a hydrocarbon moiety, generally containing from 1 to about 20 carbon atoms;

n is 1 to 2, each m is independently 1 to 3 and

Z is a pendant group selected from the group consisting of —Cl, —Br, —I, —NO$_2$, —SO$_3^-$, —H, —CN, —NCO, —OCN, —CO$_2^-$, —OH, —OR$_1$', —SR$_1$', —C(O)N(R$_1$')$_2$, —N(R$_1$')C(O)R$_1$', —N(R$_1$')SO$_2$R$_1$', —SO$_2$N(R$_1$')$_2$, —SO$_2$R$_1$', SOR$_1$', —OC(O)R$_1$', —C(O)OR$_1$', —C(O)R$_1$', —Si(OR$_1$')$_3$, —Si(R$_1$')$_3$, and an epoxy group; where R$_1$' is independently H, an unbranched or branched, cyclic or acyclic saturated or unsaturated alkyl group; and $R_f$ is a highly fluorinated alkylene moiety.

In another aspect, this invention relates to chemically amplified photoresist compositions that may be imaged by selective exposure to actinic radiation. The photoresist compositions comprise at least one ionic photoacid generator of the present invention, dispersed or dissolved in a suitable resist polymer matrix. The photoresist compositions are typically utilized in the form of a thin film coating on an appropriate substrate, such as a silicon wafer and are useful, for example, in the patterning of silicon chips used in the manufacture of integrated circuits. Chemically amplified resist systems based upon acid catalyzed chain reactions (e.g., polymerization, depolymerization, side-chain cleavage, etc.) are recognized in the art as a preferred class of resist systems for micro- or nanolithography due to the high spectral sensitivity provided by the acid-catalyzed or initiated chemical amplification mechanism, and the insensitivity of such systems to oxygen, a common inhibitor of free radical processes.

Ionic photoacid generators comprising photoactive cationic moieties and segmented, highly fluorinated-hydrocarbon anionic moieties exhibit improved solubility in organic media, and provide acids with high acid strength and/or very strong catalytic activity. These anions are stable, and non-nucleophilic, yet they do not contain highly toxic elements such as arsenic and antimony or semiconductor incompatible elements such as B and P.

The initiating, curing, and/or catalytic activity of certain ionic photoacid generators and their solubility in organic compounds (particularly in low polarity compounds such as energy-curable monomers) can be improved by using particular classes of counter-anions in association with cationic groups thereof to form thermal- or photoactive catalyst generating materials. The compounds of this invention shall be referred to as photoacid generators that can be activated using many different forms of energy activation, including, but not limited to photoactivation, electron beam activation, and other electromagnetic radiation activation that stimulates, activates, or releases the active species. The catalyst-generating materials of the present invention can display improved solubility in organic media, particularly low polarity media such as energy-curable monomers and non-polar organic polymers or solvents such as ketones (e.g., methyl ethyl ketone), ethers, esters, methylene chloride, and the like.

Radiation sensitive compositions called chemically amplified photoresists are advantageous in that the catalytic imaging process can provide high photosensitivity. By virtue of their high photosensitivity and high resolution, chemically amplified photoresists are being utilized in most state of the art or next generation microlithography systems. Chemically amplified photoresists comprise a radiation sensitive, photoacid generator (PAG) that acts as a latent source of photogenerated acid. Upon exposure to actinic radiation, the photoacid generator releases an acid that subsequently catalyzes a chemical reaction in the surrounding medium in which the PAG is dissolved, generally an acid sensitive polymer. If the solubility of the photoresist increases during exposure to radiation it is termed a positive resist; if the solubility decreases it is termed a negative resist. Today's most common positive resists generally function by acid catalyzed cleavage of acid-sensitive protecting (or blocking) groups attached to a polymer chain, which, once removed, render the polymer soluble in developer. Negative resists generally involve an acid catalyzed or initiated crosslinking reaction that renders the composition insoluble, usually via polymerization of pendant monomeric groups.

More specifically, positive-working chemically amplified photoresists generally contain two-components comprising (i) a polymeric resin which has been rendered insoluble in alkaline solutions by masking at least a part of the water soluble groups on the resin with an acid cleavable protecting group and (ii) a photoacid generator. Other materials can be optionally added to improve lithographic performance such as bases and dissolution inhibitors. Upon exposure to actinic radiation, the photoacid generator produces a strong acid capable of catalytically cleaving the bond between the protecting groups and the resin, resulting in the formation of an alkali-soluble resin. A single photogenerated acid molecule is able to cleave a large number of protecting groups from the resin, thus contributing to the high sensitivity of chemically amplified positive photoresists.

Negative working photoresists generally contain a cross-linking agent or a polymerizable group linked to a soluble polymer or oligomer. The acid produced from exposure of the photoacid generator causes the exposed area to become crosslinked and therefore insoluble in developer.

The invention further comprises a photoresist coating composition comprising:
 a) the ionic PAG (described above), and
 b) a resist polymer and,
 c) optionally a coating solvent The invention further provides a method of preparing an imaged photoresist coating comprising the steps of coating a substrate with a mixture of a resist polymer and the photoacid generator of the present invention, and selectively irradiating said coating to activate said photoacid generator. The method may further comprise the step of heating said irradiated coating at elevated temperatures to effect differential solubility of said irradiated regions and the step of developing said irradiated coating to selectively dissolve soluble portions of the irradiated coating.

The invention additionally provides polymerizable compositions comprising (1) at least one of cationic addition polymerizable monomers, ethylenically-unsaturated free-radically polymerizable monomers, multifunctional or multireactive monomers polymerizable by acid-catalyzed step-growth polymerization, multifunctional or multireactive monomers polymerizable by any combination of these polymerization mechanisms, and combinations thereof; and (2) the photoacid generator of the present invention.

Advantageously, the ionic photoacid generators of the present invention comprising photoactive cationic moieties and segmented hydrocarbon-fluorocarbon-sulfonate anion moieties, produce photogenerated acids that are the conjugate acids of the PAG anions and, by virtue of their segmented structure, having a highly fluorinated organic group immediately adjacent to the sulfonic acid moiety, provide high acid strength and very strong catalytic activity. This feature results in fast photospeeds when the photoacid generators are employed in positive resist formulations and rapid cure speeds when used in polymerizable compositions and in negative resists. Further, the segmented PAG anions are stable to elevated temperatures commonly used in resist processing, and they do not contain highly toxic elements such as arsenic and antimony or semiconductor incompatible (i.e., dopant) elements such as phosphorous and boron.

Yet another advantage is the ease of tailoring the overall size, shape and polarity, of the segmented anions and therefore the diffusivity, solubility and volatility, of the photoacid, while minimizing the chain length of the highly fluorinated $R_f$ segment. Generally, large or high molecular weight PAG anions are preferred in today's advanced positive photoresist compositions because their conjugate acids are slow to diffuse in the resist polymer matrix and have low volatility, properties which are important to achieving high resolution and good image quality, respectively. However, it has recently been found that certain large perfluorinated PAG anions, such as $C_8F_{17}SO_3^-$ (PFOS), that provide good performance in positive resists are persistent in the environment and tend to bioaccumulate in the tissues of living organisms. Consequently, there is a need for large PAG anions that will provide performance in positive resists comparable to PFOS, while offering an improved environmental, health and safety profile. Relative to PFOS and other large perfluorinated anions, certain preferred segmented PAG anions of the present invention of comparable size are expected to provide similarly good lithographic performance, but be less bioaccumulative due to their lower fluorochemical content and the relatively small size of the perfluoroalkylene segment, $R_f$. Furthermore, unlike the environmentally persistent perfluoroalkanesulfonate anions, the segmented anions of the instant invention contain reactive functionalities such as C—H bonds, ether linkages, amide or ester groups, and the like that may be susceptible to chemical attack or physical degradation. Therefore, the segmented fluoroorganic anions are expected to more readily degrade in the environment by, for example, some combination of photochemical, hydrolytic, chemical or biological attack on the hydrocarbon group, Rh, or the linking group, Q, to produce relatively small fluorinated fragments that are non-bioaccumulative. As a result, they are expected to have relatively short environmental lifetimes and be relatively benign in terms of their potential impact on the environment and living organisms.

It is to be understood that the recitation of numerical ranges by endpoints includes all numbers and fractions subsumed within that range (e.g. 1 to 5 includes 1, 1.5, 2, 2.75, 3, 3.80, 4, and 5).

It is to be understood that all numbers and fractions thereof are presumed to be modified by the term "about."

It is to be understood that "a" as used herein includes both the singular and plural.

The general definitions used herein have the following meanings within the scope of the present invention.

The term "alkyl" refers to straight or branched, cyclic or acyclic hydrocarbon radicals, such as methyl, ethyl, propyl, butyl, octyl, isopropyl, tert-butyl, sec-pentyl, and the like. Alkyl groups include, for example, 1 to 12 carbon atoms, 1 to 8 carbon atoms, or 1 to 6 carbon atoms.

The term "alkenyl" refers to straight or branched unsaturated hydrocarbon radicals having one or more double bonds, such as ethylene, propylene, butylene, 1,3-pentadiene, 1,4-pentadiene, and the like. Alkenyl groups include, for example, 2 to 12 carbon atoms, or 2 to 9 carbon atoms.

The term "alkylene" refers to a divalent straight or branched saturated hydrocarbon radical such as, for example, —CH$_2$—, —CH$_2$CH$_2$—, —CH$_2$CH$_2$CH$_2$—, —CH$_2$CH$_2$CH(CH$_3$)CH$_2$—, —CH$_2$CH(CH$_2$CH$_3$)CH$_2$CH (CH$_3$)CH$_2$—, and the like. Alkylene groups include, for example, 1 to 20, 1 to 12, or 1 to 4 carbon atoms.

The term "oxaalkylene" refers to an alkylene group as defined above where one or more non-adjacent —CH$_2$— groups have been substituted with a caternary oxygen atom, such as —CH$_2$CH$_2$OCH(CH$_3$)CH$_2$—,.

The term "aryl" refers to monovalent unsaturated aromatic carbocyclic radicals having a single ring, such as phenyl, or multiple condensed rings, such as naphthyl or anthryl.

The term "alkoxy" refers to —O-alkyl with alkyl as defined above. Alkoxy groups include, for example, methoxy, ethoxy, propoxy, isopropoxy, and the like.

The term "perfluororalkylene" refers to a fully fluorinated divalent straight or branched, cyclic or acylclic, saturated hydrocarbon radical such as, for example, —CF$_2$—, —CF$_2$CF$_2$—, —CF$_2$CF$_2$CF$_2$—, —CF$_2$CF$_2$CF(CF$_3$)CF$_2$—, —CF$_2$CF(CF$_2$CF$_3$)CF$_2$CF(CF$_3$)CF$_2$—, and the like. Perfluoroalkylene groups include, for example, 1 to 12 carbon atoms, preferably 2 to 7 carbon atoms.

The term "perfluorooxaalkylene" refers to a perfluoroalkylene group as defined above where one or more non-adjacent —CF$_2$— groups have been substituted with a caternary oxygen atom such as, for example, —CF$_2$CF$_2$OCF(CF$_3$)CF$_2$—, and the like. Perfluorooxaalkylene groups include, for example, 1 to 12 carbon atoms, and preferably comprise perfluoroalkylene units of 2 to 3 carbon atoms.

The term "weight percent" refers to the percent by mass of an individual component in a total system. For example, the weight percent of an individual monomer in a polymer is the mass of the individual monomer divided by the mass of the total polymers multiplied by 100.

As used herein, "multifunctional" means the presence of more than one of the same functional reactive group in a monomer;

"multireactive" means the presence of two or more of two different functional reactive groups;

"acid catalyst" or "acid catalyzed" means catalysis by a Brönsted- or Lewis-acid species; and "molecular weight" means number average molecular weight ($M_n$), unless otherwise specified.

DETAILED DESCRIPTION OF THE PREFERRED EMBODIMENTS

The present invention provides ionic photoacid generators comprising a photochemically-reactive cationic portion and a segmented hydrocarbon-fluorocarbon-sulfonate anion. Ionic photoacid generators in which the anion comprises a highly fluorinated alkylene moiety and a hydrocarbon moiety, defined as segmented, display improved solubility in organic systems and/or generate a highly reactive initiator, curative, or catalyst upon energy activation. The salts of the present invention further avoid the use of salts of toxic elements such as arsenic and antimony, or semiconductor-incompatible elements such as B and P, and are relatively inexpensive to manufacture.

Anions useful as the anionic portion of the ionic PAG salts of the present invention may be generally represented by Formula (I), respectively, and hereinafter referred to as segmented anions.

Briefly, in one aspect of the present invention, ionic photoacid generators are provided wherein the ionic photoacid generator has (1) a cation comprising at least one of (i) a transition metal containing organometallic cation, (ii) an organic onium cation, or (iii) a mixture thereof, and (2) an anion of the formula:

$$^{-}O_3S—R_f\text{-}Q\text{-}(R_h\text{-}Z_m)_n \quad (I)$$

where:
$R_f$ is a highly fluorinated divalent moiety, preferably having having 1 to 12 catenary carbon atoms, most preferably 2 to 7 carbon atoms,
Q=a covalent bond, divalent linking group or a trivalent linking group,
$R_h$ is a hydrocarbon moiety, generally containing from 1 to about 20 carbon atoms;
n is 1 to 2;
each m is independently 1 to 3;
Z is a pendant group selected from the group consisting of —Cl, —Br, —I, —NO$_2$, —SO$_3^-$, —H, —CN, —NCO, —OCN, —CO$_2^-$, —OH, —OR$_1$', —SR$_1$', —C(O)N(R$_1$')$_2$, —N(R$_1$')C(O)R$_1$', —N(R$_1$')SO$_2$R$_1$', —SO$_2$N(R$_1$')$_2$, —SO$_2$R$_1$', —SOR$_1$', —OC(O)R$_1$', —C(O)OR$_1$', —C(O)R$_1$', —Si(OR$_1$')$_3$, —Si(R$_1$')$_3$, and an epoxy group, where R$_1$' is independently H, an unbranched or branched, cyclic or acyclic, saturated or unsaturated alkyl group.

$R_f$ is a highly fluorinated divalent alkylene moiety and may contain from 1–12 carbon atoms, with 2–7 carbon atoms preferred. The $R_f$ highly fluorinated alkylene chains may be unbranched, branched, acyclic or cyclic, saturated or unsaturated, and preferably are acyclic and saturated. Heteroatoms or radicals such as divalent oxygen, trivalent nitrogen or hexavalent sulfur may interrupt the skeletal chain, as is well recognized in the art. When $R_f$ is or contains a cyclic structure, such structure preferably has 5 or 6 ring members, 1 or 2 of which can be heteroatoms.

By "highly fluorinated" is meant that the degree of fluorination on the chain is sufficient to provide the chain with properties similar to those of a perfluorinated chain. More particularly, a highly fluorinated divalent group will have fluorine to hydrogen ratio of greater than 2, preferably greater than 4. Although hydrogen atoms may remain on the chain, it is most preferred that all hydrogen atoms be replaced with fluorine to form a perfluoroalkylene (or perfluorooxalkylene) group.

The linking group Q can be a covalent bond. Representative examples of other suitable divalent Q linking groups include the following:

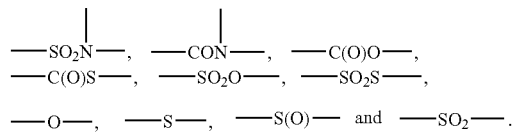

$R_h$ is independently selected from cyclic or acyclic, branched or unbranched, saturated or unsaturated organic hydrocarbon radicals having from 1 to 20 carbon atoms. Preferably $R_h$ has 1–8 carbon atoms. Optionally, $R_h$ or $R_1$ may comprise polymerizable groups, such as olefinic moieties.

Z is a pendant group selected from the group consisting of —Cl, —Br, —I, —NO$_2$, —SO$_3^-$, —H, —CN, —NCO, —OCN, —CO$_2^-$, —OH, —OR$_1$', —SR$_1$', —C(O)N(R$_1$')$_2$, —N(R$_1$')C(O)R$_1$', —N(R$_1$')SO$_2$R$_1$', —SO$_2$N(R$_1$')$_2$, —SO$_2$R$_1$', SOR$_1$', —OC(O)R$_1$', —C(O)OR$_1$', —C(O)R$_1$', —Si(OR$_1$')$_3$, —Si(R$_1$')$_3$, and an epoxy group; where R$_1$' is independently H, an unbranched or branched, cyclic or acyclic saturated or unsaturated lower alkyl group. Z may comprise a polymerizable group such as —OC(O)C(CH$_3$)=CH$_2$, —OC(O)CH=CH$_2$, —NHC(O)CH=CH$_2$ and —NHC(O)C(CH$_3$)=CH$_2$.

Many previously known ionic photoacid generators used in positive chemically amplified photoresists contain perfluorooctyl moieties, such as the perfluorooctanesulfonate anion (PFOS). It has been reported that certain perfluorooctyl-containing compounds may tend to bio-accumulate in living organisms; this tendency has been cited as a potential concern regarding some fluorochemical compounds. For example, see U.S. Pat. No. 5,688,884 (Baker et al.). As a result, there is a desire for fluorine-containing ionic PAG compositions which are effective in providing desired photoresist performance, and which eliminate more effectively from the body (including the tendency of the composition and/or its degradation products).

It is expected that the preferred ionic photoacid generators of the present invention, which contain anions with relatively short fluoroalkylene segments (<8 fluorinated carbon atoms), and reactive hydrocarbon segments, when exposed to biological, thermal, oxidative, hydrolytic, and photolytic conditions found in the environment, will break down to functional, short chain fluorocarbon degradation products that will not bio-accumulate. For example, compositions of the present invention comprising a perfluorobutylene-sulfonate anion moiety, such as $R_h$—O—$CF_2CF_2CF_2SO_3^-$, are expected to degrade ultimately to the corresponding difunctional carboxylate-sulfonate salt, $^-OOC(CF_2)_3$—$SO_3^-$ containing only three contiguous perfluorinated carbon atoms. Similarly, it has been surprisingly found that perfluorobutylsulfonate, with four contiguous perfluorinated carbon atoms, tested in the form of its potassium salt, eliminates from the body more effectively than perfluorohexylsulfonate and much more effectively than perfluorooctylsulfonate. For this reason preferred embodiments of the $R_f$ group in Formula I include perfluoralkylene groups, —$C_mF_{2m}$—, and perfluorooxaalkylene groups, —$(C_mF_{2m}O)_o$—$C_nF_{2n}$—, containing a total of no more than 7 carbon atoms, preferably no more than 4 carbon atoms.

Representative segmented anions of the present invention include, but are not limited to:
$CH_3O(CF_2)_4SO_3^-$, $C_2H_5O(CF_2)_4SO_3^-$, $C_4H_9O(CF_2)_4SO_3^-$, $C_6H_5CH_2O(CF_2)_4SO_3^-$, $C_4H_9(CF_2)_4SO_3^-$, $C_4H_9(CF_2)_2SO_3^-$, $C_2H_5OCF_2CF(CF_3)SO_3^-$, $CH_2$=$CHCH_2O(CF_2)_4SO_3^-$, $CH_3OCF_2CF(CF_3)O(CF_2)_4SO_3^-$, $C_2H_5OCF_2CF(CF_3)O(CF_2)_4SO_3^-$, $(CF_3)_2CFCF(OC_2H_5)CF_2CF_2CF_2SO_3^-$, $(CF_3)_2CFCF(OCH_3)CF_2CF_2CF_2SO_3^-$, $CH_3OCF_2CF(CF_3)SO_3^-$, $C_4H_9OCF_2CF(CF_3)SO_3^-$, $C_8H_{17}O(CF_2)_2SO_3^-$, $C_4H_9O(CF_2)_2SO_3^-$, $(CH_2$=$CHCH_2)_2NSO_2CF_2CF_2CF_2SO_3^-$, $(CH_2$=$CHCH_2)_2NCOCF_2CF_2CF_2SO_3^-$, $(C_2H_5)_2NSO_2CF_2CF_2CF_2SO_3^-$, $(C_2H_5)_2NSO_2CF_2CF_2CF_2CF_2SO_3^-$, n-$C_4H_9OC(O)CF_2CF_2CF_2SO_3^-$, $(CH_3)_3COC(O)CF_2CF_2CF_2SO_3^-$, $(C_6H_5)OSO_2CF_2CF_2CF_2SO_3^-$, $CH_3OCF_2CF(CF_3)OCF_2CF_2SO_3^-$, $HO(CH_2)_3O(CF_2)_4SO_3^-$, and $^-O_3S(CH_2)_3(CF_2)_4SO_3^-$.

Difunctional or cyclic fluorochemical intermediates that are useful in preparing segmented anions of the present invention using methods that are generally known in the art include:

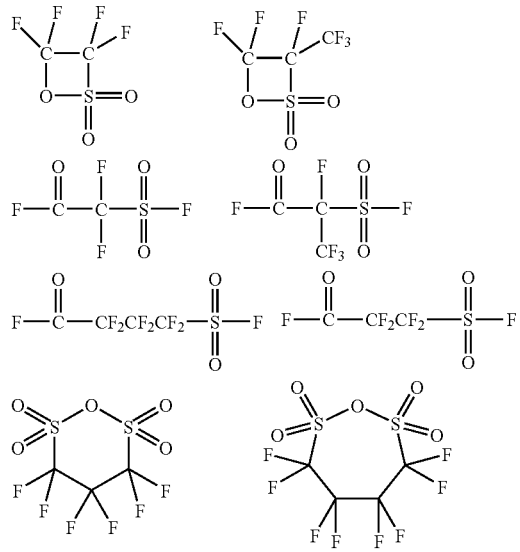

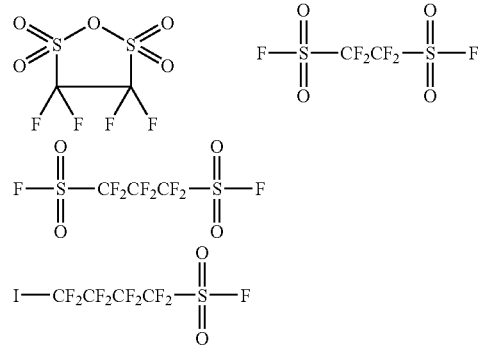

Cations useful as the cationic portion of the catalysts and initiators of the invention include:

(1) organic onium cations, for example those described in U.S. Pat. Nos. 4,250,311, 3,708,296, 4,069,055,4,216,288, 5,084,586 and 5,124,417 and such descriptions incorporated herein by reference, including aliphatic or aromatic Group IVA-VIIA (CAS version) centered onium salts, preferably I- , S- , P- , Se- N- and C-centered onium salts, such as those selected from, sulfoxonium, iodonium, sulfonium, selenonium, pyridinium, carbonium and phosphonium, and most preferably I- , and S-centered onium salts, such as those selected from sulfoxonium, diaryliodonium, triarylsulfonium, diarylalkylsulfonium, dialkylarylsulfonium, and trialkylsulfonium wherein "aryl" and "alkyl" means an unsubstituted or substituted aromatic or aliphatic moiety, respectively, having up to four independently selected substituents. The substituents on the aryl or alkyl moieties will preferably have less than 30 carbon atoms and up to 10 heteroatoms selected from N, S, non-peroxidic O, P, As, Si, Sn, B, Ge, Te, Se. Examples include hydrocarbyl groups such as methyl, ethyl, butyl, dodecyl, tetracosanyl, benzyl, allyl, benzylidene, ethenyl and ethynyl; hydrocarbyloxy groups such as methoxy, butoxy and phenoxy; hydrocarbylmercapto groups such as methylmercapto and phenylmercapto; hydrocarbyloxycarbonyl groups such as methoxycarbonyl and phenoxycarbonyl; hydrocarbylcarbonyl groups such as formyl, acetyl and benzoyl; hydrocarbylcarbonyloxy groups such as acetoxy and cyclohexanecarbonyloxy; hydrocarbylcarbonamido groups such as acetamido and benzamido; azo; boryl; halo groups such as chloro, bromo, iodo and fluoro; hydroxy; oxo; diphenylarsino; diphenylstibino; trimethylgermano; trimethylsiloxy; and aromatic groups such as cyclopentadienyl, phenyl, tolyl, naphthyl, and indenyl. With the sulfonium salts, it is possible for the substituent to be further substituted with a dialkyl- or diarylsulfonium cation; an example of this would be 1,4-phenylene bis (diphenylsufonium). Additionally, diazonium cations such as

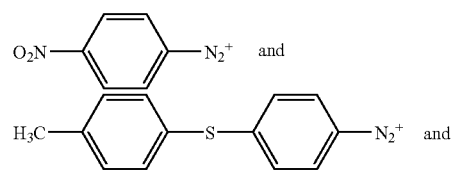

pyridinium cations such as

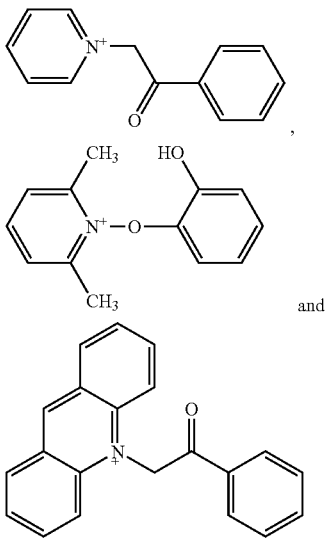

and essentially equivalent structures thereof are included.

(2) organometallic complex cations essentially free of metal hydride or metal alkyl functionality selected from those described in U.S. Pat. No. 4,985,340 and such description is incorporated herein by reference and has the formula:

$$[(L^1)(L^2)M]^{+q} \quad (1)$$

wherein

M represents a metal selected from the group consisting of Cr, Mo, W, Mn, Re, Fe, Ru, Os, Co, Rh, Ir, Pd, Pt and Ni, preferably Cr, Mo, W, Mn, Fe, Ru, Co, Pd, and Ni; and most preferably Mn and Fe;

$L^1$ represents 1 or 2 cyclic, polyunsaturated ligands that can be the same or different ligand selected from the group consisting of substituted and unsubstituted cyclopentadienyl, cyclohexadienyl, and cycloheptatrienyl, cycloheptatriene, cyclooctatetraene, heterocyclic compounds and aromatic compounds selected from substituted or unsubstituted arene compounds and compounds having 2 to 4 fused rings, and units of polymers, e.g., a phenyl group of polystyrene, poly(styrene-co-butadiene), poly(styrene-co-methyl methacrylate), poly(α-methylstyrene), and the like; a cyclopentadiene group of poly(vinylcyclopentadiene); a pyridine group of poly(vinylpyridine), and the like, each capable of contributing 3 to 8 electrons to the valence shell of M;

$L^2$ represents none, or 1 to 3 nonanionic ligands contributing an even number of electrons that can be the same or different ligand selected from the group of carbon monoxide, ketones, olefins, ethers, nitrosonium, phosphines, phosphites, and related derivatives of arsenic and antimony, organonitriles, amines, alkynes, isonitriles, dinitrogen, with the proviso that the total electronic charge contributed to M results in a net residual positive charge of q to the complex;

q is an integer having a value of 1 or 2, the residual charge of the complex cation; and Organometallic salts are known in the art and can be prepared as described in, for example, EPO No. 094,914 and U.S. Pat. Nos. 5,089,536, 4,868,288, and 5,073,476, and such descriptions are incorporated herein by reference. The organometallic initiators of the present invention are generally stable and active under ambient conditions that may include normal levels of atmospheric oxygen and water.

Examples of preferred cations for use in PAG compositions of the present invention include, but are not limited to the onium cations: diphenyliodonium, ditolyliodonium, didodecylphenyliodonium, (4-octyloxyphenyl)phenyliodonium, and bis(methoxyphenyl)iodonium; triphenylsulfonium, diphenyl-4-thiophenoxyphenylsulfonium, 1,4-phenylene-bis(diphenylsulfonium); bis-(4-t-butylphenyl)-iodonium, (4-t-butyl-phenyl)-diphenyl-sulfonium, tris-(t-butyl-phenyl)-sulfonium, (4-butoxy-phenyl)-diphenylsulfonium, 1-(2-naphthalen-2-yl-2-oxo-ethyl)-tetrahydro-thiophenium, dimethyl-(2-oxo-cyclohexyl)-sulfonium, bicyclo[2.2.1]hept-2-yl-methyl-(2-oxo-cyclohexyl)-sulfonium, cyclohexyl-methyl-(2-oxo-cyclohexyl)-sulfonium, dimethyl-(2-oxo-2-phenyl-ethyl)-sulfonium, (4-hydroxy-3,5-dimethyl-phenyl)-dimethylsulfonium, and (4-isopropyl-phenyl)-p-tolyl-iodonium; and the organometallic cations: bis($\eta^5$-cyclopentadienyl)iron (1+), bis($\eta^5$-methylcyclopentadienyl) iron (1+), ($\eta$5-cyclopentadienyl)($\eta^5$-methylcyclopentadienyl) iron (1+), bis($\eta^5$-trimethylsilylcyclopentadienyl) iron (1+); bis($\eta^6$-xylenes) iron (2+), bis($\eta^6$-mesitylene) iron (2+), bis($\eta^6$-durene) iron (2+), bis($\eta^6$-pentamethylbenzene) iron (2+), and bis($\eta^6$-dodecylbenzene) iron (2+); ($\eta^5$-cyclopentadienyl)($\eta^6$-xylenes) iron(1+), ($\eta^5$-cyclopentadienyl)($\eta^6$-toluene) iron(1+), ($\eta_5$-cyclopentadienyl)($\eta^6$-mesitylene) iron(1+), ($\eta^5$-cyclopentadienyl)($\eta$6-pyrene) iron(1+), $\eta^5$-cyclopentadienyl)($\eta^6$-naphthalene) iron(1+), ($\eta^5$-cyclopentadienyl)($\eta^6$-dodecylphenyl) iron(1+) and mixtures thereof.

In general, ionic PAGs of the instant invention can be prepared by ion exchange or metathesis reactions by combining onium or organometallic salts that contain conventional counteranions, such as chloride, bromide, acetate, triflate, $PF_6^-$, $SbF_6^-$ or $BF_4^-$, with simple alkali or alkaline earth metal salts or ammonium salts of the segmented anions of the invention in a suitable solvent.

Generally, metathesis reactions may be carried out at temperatures ranging from about −80 to about 100° C., preferably at ambient temperature, under conditions in which either the PAG salt of the instant invention or the metathesis byproduct(s) selectively precipitates, thus permitting isolation of the salt of the invention in the form of a solution or a pure solid. Alternatively, ion exchange may be carried out in a mixed solvent system where one of the solvents is water and the other solvent is a non-miscible organic solvent and the ionic PAG products are separated from the byproducts of ion exchange by selective partitioning to the separate phases. Normally the ionic PAGs of the present invention partition into the organic phase and the byproduct salts partition into the aqueous phase. Separation may be achieved using a separatory funnel or similar device. Further purification may be achieved by washing the organic solution of the ionic PAG product with pure water to remove residual salt contaminants. The ionic PAG may then be isolated by stripping the organic solvent or by precipitation or recrystallizaton with a nonsolvent.

Suitable metathesis solvents generally are capable of dissolving at least one and preferably all of the reagents required for the metathesis reaction without reacting with these reagents. Solvents are generally selected such that the desired salt or the metathesis byproducts selectively precipitate, thus allowing the desired salt to be isolated in relatively pure form. Where a mixture of water and an organic solvent is used, the organic solvent is typically chosen based on its ability to selectively extract the desired ionic PAG product, while leaving the starting materials and the byproduct salts in the aqueous solution. Normally, the preferred solvent for a particular system is determined empirically. Nonlimiting examples of suitable solvents include, water; chlorocarbons, such as methylene chloride, and chloroform; ethers; aromatic hydrocarbons, such as toluene, and chlorobenzene; nitriles, such as, acetonitrile; alcohols, such as methanol and ethanol; nitrobenzene; nitromethane; ketones, such as acetone and methyl ethyl ketone; and other similar classes of organic solvents. Mixtures of solvents are often desirable to control solubility of reagents and product salts. It is to be noted that cationic organometallic catalysts employing the counterions of the invention can be prepared in, e.g., protic solvents and in the presence of oxygen, in contrast to certain known organometallic catalysts used.

The PAG salts of the invention will form in situ if the individual PAG precursors described supra are added directly to the polymerizable or resist composition and a suitable solvent or diluent, including monomer, is used. It is preferred, however, to form the pure catalyst or initiator in a separate step as a solid or in a suitable solvent prior to adding the same to the polymerizable or resist composition and performing the photochemical process.

PAG salts of the above described anions and cations may be activated by radiation or may require two stage activation involving radiation followed by heat. Suitable salts having photoactivatable cations and a segmented anion for use in the polymerizable or resist compositions of the instant invention are those salts that upon application of sufficient energy; accelerated particle (electron beam, ion beam), or electromagnetic radiation sources employing x-ray, extreme-UV, deep-UV, mid-UV near-UV and visible radiation will generate an acid species capable of initiating or catalyzing the desired polymerization, depolymerization, or deblocking chemistry. The level of photocatalyst or initiator activity, and the preferred wavelength of actinic radiation will of course depend on the choice of cation and segmented anion in the ionic PAG and on the monomer or resist system chosen.

The present invention provides novel chemically amplified photoresist compositions that may be imaged by selective exposure to actinic radiation. The photoresist compositions comprise photochemically active salts of the segmented fluoroorganic anions, described above, dispersed or dissolved in a suitable resist polymer matrix. Optionally a coating solvent may also be present. The photoresist compositions are typically utilized in the form of a thin film coating on an appropriate substrate, such as a silicon wafer, various metal clad substrates used in manufacturing circuit boards or a metal printing plate. The photoresist films are generally coated from a photoresist solution comprising the ionic PAG, the resist polymer and a coating solvent using solution-coating techniques, such as spin coating. Coating solvents that may be used to prepare thin film photoresist compositions of the present invention include, but are not limited to, propyleneglycol methyl ether acetate (PGMEA), ethyl lactate, ethyl acetate, cyclohexanone, and super critical carbon dioxide. After coating the photoresist composition onto a substrate, a pre-exposure bake step is generally employed to anneal the film and remove residual coating solvent.

Selective irradiation of the photoresist coating is typically achieved by exposure through a mask, although other selective irradiation techniques may also be employed, such as laser writing. Upon irradiation, the photoactive salts undergo photochemical decomposition to produce a mixture of highly reactive products, including strong acid and free radicals.

Suitable polymers useful as photoresist matrix materials (or binders) contain functional groups that are reactive towards the photochemically produced acid or free-radicals. The polymer functional groups undergo secondary, non-photochemical chain reactions with these highly reactive species, a chemical amplification process that ultimately alters the solubility or volatility of the polymer in the irradiated regions. Photoresist compositions that increase in solubility (or volatility) upon exposure to actinic radiation are termed positive photoresists, whereas, those that decrease in solubility are termed negative photoresists. Changes in solubility can result, for example, from radical- or acid-induced crosslinking of the polymer, as in a negative photoresist, or from acid-catalyzed cleavage of polymer functional groups and conversion of the polymer to a more soluble or volatile form, as in a positive photoresist. These secondary reactions may occur under ambient conditions or in a post-bake step carried out at elevated temperatures. When carried out under the proper conditions, the differential solubility produced in the irradiated and non-irradiated portions of the polymer is sufficient to allow selective dissolution of only the more soluble portions of the exposed photoresist layer using a developer solution, thus creating a relief image. Developer solutions may be organic or aqueous based mixtures or solutions, but typically comprise a dilute solution of aqueous base. Alternatively, the acid-catalyzed cleavage of functional groups in the main backbone of a polymer chain may produce only low molecular weight, volatile products which are liberated from the irradiated regions under appropriate conditions, thus negating the need for post-exposure development with solvents.

For semiconductor photoresist applications, ionic photo-acid generators containing organic onium cations are preferred over the ionic photoacid generators containing organometallic complex cations because metal-containing organometallic complex cations may introduce unwanted metal contaminants into the semiconductor chip manufacturing process.

Chemically amplified resist systems based upon acid catalyzed chain reactions (e.g., polymerization, depolymerization, side-chain cleavage, etc.) are recognized as a preferred class of resist system for micro- or nanolithography due to the high spectral sensitivity provided by the acid-catalyzed or initiated chemical amplification mechanism and the insensitivity of such systems to oxygen, a common inhibitor of free radical processes. It is also recognized that positive-working photoresists are generally capable of providing better image resolution than negative working photoresists and are therefore preferred in applications where very fine-line image resolution is required, as in the manufacture of semiconductor devices.

Polymers useful as matrix materials for photoresists of the present invention may be chosen from any of a wide variety of polymer structures possessing functional groups that are reactive with acid or free radicals. The functional groups may be present as pendant groups attached to the polymer chain, terminal end-groups, or may be contained within the polymer backbone itself. Common free radical- or acid-polymerizable functional groups useful in preparing negative photoresists which crosslink upon exposure include but are not restricted to epoxy groups, alcohol groups, acrylate groups, acrylamide groups, vinyl ether groups, olefinic groups, vinyl amine groups, cyclic ether groups, cyclic ester groups, cyclic carbonate groups, cyclic acetal groups, oxazoline groups, alkoxysilane groups, cyclosiloxane groups and mixtures thereof. Acid labile functional groups that are useful in the preparation of positive photoresists include but are not restricted to ester groups (especially t-butyl esters, t-adamantyl esters, secondary allylic esters, secondary beta-ketoesters, alpha-tetrahydropyran esters and alpha-tetrahydrofuran esters), carbonate groups (especially t-butyl carbonates), silyl ether groups, acetal and ketal groups, and ether groups (especially t-butyl ethers). Positive photoresists may also be obtained by incorporating low molecular weight, acid labile dissolution inhibitors such as t-butylcholate into a resin matrix.

Polymer backbones useful in photoresist compositions of the present invention span a wide range of structural types and are usually chosen based upon the particular balance of optical, chemical and physical properties desired for a given application. Important considerations in choosing a suitable polymer backbone include optical clarity, transmittance at the irradiating frequency, refractive index, adhesion to the substrate, plasma etch resistance, solubility and film forming characteristics. Polymer backbones commonly employed in photoresist applications and suitable for use in the present invention include, but are not restricted to, polyphthaldehyde, polyacrylates, polymethacrylates, polystyrenes, polycycloolefins (including polymers derived from radical, ROMP and transition metal-catalyzed addition polymerization of norbornene and related polycyclic olefins), polycycloolefin-maleic anhydride copolymers, copolymers of fluoroolefins with cycloolefins, and phenol-formaldehyde condensation polymers. Various copolymers of the above named homopolymers can also be used.

Resist compositions of this invention may be applied, preferably as a liquid, to a substrate such as a silicon wafer, steel, aluminum, copper, cadmium, zinc, ceramic, glass, paper, wood or various plastic films such as poly(ethyleneterephthalate), plasticized poly(vinylchloride), polypropylene, polyethylene, polyimide, and the like, and irradiated and/or heated. By chemically altering the solubility of part of the coating, as by irradiation through a mask followed by a post exposure bake step, those sections that are soluble may be washed away with a solvent (or developer) while leaving the insoluble portions in place. Thus, ionic PAG containing resist compositions of this invention may be used in the production of articles useful in the graphic arts, recording, and electronics industries, such as integrated circuit chips, printing plates, data storage media, printed circuits, and photoimageable electronic packaging.

A variety of additives and adjuvants may be added to positive and negative resist compositions of the invention to improve resist performance, including sensitizers, dissolution inhibitors, surfactants, leveling agents, bases or acid scavengers and stabilizers. Art-known PAGs, either neutral or ionic, may also be used in combination with the ionic PAGs of the present invention in order to optimize the lithographic performance of photoresist compositions of the instant invention.

In the radiation sensitive resist compositions of this invention, the ionic photoacid generators can be present in a catalytically effective amount to initiate polymerization (for negative photoresists) or depolymerization or deblocking (for positive photoresists), and is generally in the range of 0.01 to 20 wt. %, preferably 0.1 to 10 wt. %, most preferably 1 to 5 wt. % of the total polymeric resin composition; i.e., the total composition excluding any solvent that may be present.

The present invention also provides polymerizable coating compositions comprising (1) at least one of cationically polymerizable monomers, ethylenically-unsaturated free radically polymerizable monomers, multifunctional or multi-reactive monomers polymerizable by acid-catalyzed step-growth polymerization, multifunctional or multi-reactive monomers polymerizable by any combination of these polymerization mechanisms, or mixtures thereof and (2) an ionic PAG of the present invention.

The present invention also provides a method for the polymerization comprising the steps of:

(a) providing a monomer mixture comprising at least one of cationically polymerizable monomer, an ethylenically-unsaturated free radically polymerizable monomer, or multifunctional or multi-reactive monomers polymerizable by acid-catalyzed step-growth polymerization, or multifunctional or multi-reactive monomers polymerizable by any combination of these polymerization mechanisms, and mixtures thereof, and a catalytically effective amount of a curing agent to the monomer mixture wherein the curing agent comprises at least one of the ionic PAGs of the instant invention (and all permutations of the order of mixing the aforementioned components), thereby forming a polymerizable composition, and (b) polymerizing the mixture composition with a sufficient amount of actinic radiation.

The present invention further provides a method for preparing coated articles containing the cured composition of the invention comprising the steps of:

(a) providing a substrate, (b) coating an energy polymerizable composition of the invention, as described above, onto at least one surface of the substrate by methods known in the art, such as bar, knife, reverse roll, knurled roll, curtain, or spin coating, or by dipping, spraying, brushing, and the like, with or without a coating solvent, and (c) applying energy (after evaporation of solvent, if necessary) to the coating and, if desired, to the article to cause the polymerization of the coating.

It may be desirable to add solvent to solubilize components and aid in processing. Solvent, preferably organic solvent, may be present in an amount up to 99 weight percent, preferably in the range of 0 to 90 weight percent, and most preferably in the range of 0 to 75 weight percent, of the total composition.

To prepare a structural/semi-structural epoxy adhesive, the curable composition could contain additional adjuvants such as silica fillers, glass bubbles and tougheners. These adjuvants add toughness to and reduce the density of the cured composition. Generally shorter chain polyols would be used to give toughness through chain extension of the cured epoxy. Too long a chain diol generally would produce too soft a cured composition that would not have the strength needed for structural/semi-structural applications. Using polyols having high hydroxyl functionality (e.g., greater than three) could produce an over-crosslinked material resulting in a brittle adhesive.

To prepare magnetic media using the materials of the present invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare protective coatings, the choice of materials depends on the needs of the specific application. Abrasion resistant coatings are generally hard and require a significant portion of the formulation to be a hard resin, which are generally short chain length and have high functionality. Coatings undergoing some flex require toughness that can be obtained by lowering the crosslink density of the cure formulation. Clear coatings require the cured resins to have little to no phase separation. This obtained by controlling the compatibility of the resins or controlling phase separation by cure rate. Adjuvants could be added to these coating formulations in an amount effective for their intended use.

In the polymerizable compositions of this invention, the ionic photoacid generators can be present in a catalytically effective amount to initiate polymerization, and is generally in the range of 0.01 to 20 weight percent (wt %), preferably 0.1 to 10 wt % of the overall polymeric resin composition; i.e., the total composition excluding any solvent that may be present.

A wide variety of monomers can be energy polymerized using the photoacid generators of the invention. Included are monomers selected from the group consisting of cationically polymerizable monomers, free-radically-polymerizable monomers, and acid-catalyzed step-growth polymerizable monomers. Preferred monomers are acid-catalyzed step-growth polymerizable monomers and cationically polymerizable monomers, with the more preferred monomers being the cationically polymerizable monomers.

Suitable cationically polymerizable monomers and/or oligomers typically contain at least one cationically polymerizable group such as epoxides, cyclic ethers, vinyl ethers, vinylamines, side-chain unsaturated aromatic hydrocarbons, lactones and other cyclic esters, lactams, oxazolines, cyclic carbonates, cyclic acetals, aldehydes, cyclic amines, cyclic sulfides, cyclosiloxanes, cyclotriphosphazenes, certain olefins and cycloolefins, and mixtures thereof, preferably epoxides and vinyl ethers. Other cationically polymerizable groups or monomers described in G. Odian, "Principles of Polymerization" Third Edition, John Wiley & Sons Inc., 1991, N.Y. and "Encyclopedia of Polymer Science and Engineering," Second Edition, H. F. Mark, N. M. Bikales, C. G. Overberger, G. Menges, J. I. Kroschwitz, Eds., Vol. 2, John Wiley & Sons, 1985, N.Y., pp. 729–814 are also useful in the practice of the present invention.

Particularly useful examples include cyclic ether monomers, including epoxide monomers described in U.S. Pat. No. 4,985,340 and such description is incorporated herein by reference. A wide variety of commercial epoxy resins are available and listed in "Handbook of Epoxy Resins" by Lee and Neville, McGraw Hill, New York (1967) and in "Epoxy Resin Technology" by P. F. Bruins, John Wiley & Sons, New York (1968). Preferably, when used in conductive adhesives, the epoxy resins are "electronic grade," that is, low in ionic contaminants.

Useful epoxy resins can include propylene oxide, epichlorohydrin, styrene oxide and epoxies based upon bisphenol A, such as, EPON-828-LS™ electronic grade epoxy resins available from Shell Chemicals, or novolac epoxies, such as, EPON-164™ (also available from Shell Chemicals) or their equivalents from other manufacturers. Additional useful epoxy resins include dicylopentadiene dioxide, epoxidized polybutadiene such as the Poly BD™ resins available from Elf Atochem, 1,4-butanediol diglycidyl ether, and resorcinol diglycidyl ether. Also useful are the cycloaliphatic epoxies, such as cyclohexene oxide and the ERL™ series of resins available from Union Carbide, such as vinylcyclohexene dioxide (ERL-4206™), 3,4-epoxycyclohexylmethyl-3,4-epoxycyclohexanecarboxylate (ERL-4221™), bis(3,4-epoxy-6-methylcyclohexylmethyl)adipate (ERL-4299™); 1,4-butanediol diglycidyl ether, (for example, Heloxy 67™ available from Shell Chemical), polyglycidyl ether of phenol-formaldehyde novolak (e.g., DER-431™ and DER-438™, available from Dow Chemical Co., polyglycol diepoxide (e.g., DER 736™, available from Dow Chemical Co.), and mixtures thereof as well as mixtures thereof with co-curatives, curing agents or hardeners that also are well known. Representative of these well-known co-curatives or hardeners that can be used are acid anhydrides such as maleic anhydride, cyclopentanetetracarboxylic acid dianhydride, pyromellitic anhydride, cis-1,2-cyclohexanecarboxylic acid anhydride, and mixtures thereof.

Epoxy resins preferred for use in conductive adhesives are the glycidyl ether type of resins, particularly in formulations where stabilizers are present.

When preparing compositions containing epoxy monomers, hydroxy-functional materials can be added. The hydroxyl-functional component can be present as a mixture or a blend of materials and can contain mono- and poly-hydroxyl containing materials. Preferably, the hydroxyl-functional material is at least a diol. When used, the hydroxyl-functional material can aid in chain extension and preventing excess crosslinking of the epoxy during curing, e.g., increasing toughness of the cured composition.

When present, useful hydroxyl-functional materials include aliphatic, cycloaliphatic or alkanol-substituted arene mono- or poly-alcohols having from about 2 to about 18 carbon atoms and two to five, preferably two to four hydroxy groups, or combinations thereof. Useful mono-alcohols can include methanol, ethanol, 1-propanol, 2-propanol, 2-methyl-2-propanol, 1-butanol, 2-butanol, 1-pentanol, neopenyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol and tetrahydrofurfuryl alcohol.

Polyols useful in the present invention include aliphatic, cycloaliphatic, or alkanol- substituted arene polyols, or mixtures thereof having from about 2 to about 18 carbon atoms and two to five, preferably two to four hydroxyl groups.

Examples of useful polyols include 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethlene glycol, triethylene glycol, tetraethylene glycol, glycerine, 2-ethy-2-(hydroxymethyl)-1,3-propanediol, 2-ethyl-1,3-pentanediol, 1,4-cyclohexanedimethanol, 1,4-benzenedimethanol, and polyalkoxylated bisphenol A derivatives. Other examples of useful polyols are disclosed in U.S. Pat. No. 4,503,211.

Higher molecular weight polyols include the polyethylene and polypropylene oxide polymers in the molecular weight ($M_n$) range of 200 to 20,000 such as the Carbowax™ polyethyleneoxide materials available from Union Carbide, caprolactone polyols in the molecular weight range of 200 to 5,000 such as the Tone™ polyol materials available from Union Carbide, polytetramethylene ether glycol in the molecular weight range of 200 to 4,000, such as the Terathane™ materials available from DuPont, polyethylene glycol, such as PEG 200 available from Union Carbide, hydroxyl-terminated polybutadiene resins such as the Poly BD™ materials available from Elf Atochem, phenoxy resins, such as those commercially available from Phenoxy Associates, Rock Hill, S.C., or equivalent materials supplied by other manufacturers.

Cationically-polymerizable vinyl and vinyl ether monomers are also particularly useful in the practice of this invention and are described in U.S. Pat. No. 4,264,703, and such description is incorporated herein by reference.

Suitable free-radically polymerizable compounds containing at least one ethylenically unsaturated double bond, may be monomers and/or oligomers, such as (meth)acrylates, (meth)acrylamides, and other vinyl compounds capable of undergoing free-radical polymerization. Such monomers and specific examples are more fully described in U.S. Pat. No. 4,985,340, and such description is incorporated herein by reference.

Such monomers include mono-, di-, or polyacrylates and methacrylates such as methyl acrylate, methyl methacrylate, ethyl acrylate, isopropyl methacrylate, isooctyl acrylate, acrylic acid, n-hexyl acrylate, 2-ethylhexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol dimethacrylate, 1,6-hexanediol diacrylate, trimethylolpropane triacrylate, 1,4-cyclohexanediol diacrylate, pentaerythritol triacrylate, -tetraacrylate and -tetramethacrylate, the bis-acrylates and bis-methacrylates of polyethylene gycols of molecular weight 200–500; multi-reactive monomers such as epoxy (meth)acrylates, isocyanatoalkyl (meth)acrylates such as isocyanatoethyl (meth)acrylate, hydroxyalkyl (meth)acrylates, such as hydroxyethyl- and hydroxypropyl (meth)acrylates, acrylated epoxies, such as ethoxylated bisphenol A di(meth)acrylate, glycidyl (meth)acrylate; unsaturated amides such as acrylamide, methylene bis-acrylamide and β-methacrylaminoethyl methacrylate; and vinyl compounds such as styrene, divinylbenzene, divinyl adipate and various vinyl azlactones as are disclosed in U.S. Pat. No. 4,304,705. Mixtures of more than one monomer can be used as desired.

Acid-catalyzed step growth polymerizations include, but are not limited to, the reaction of multifunctional isocyanates (polyisocyanates) with multifunctional alcohols (polyols) to form polyurethanes, the reaction of multifunctional epoxies with multifunctional alcohols, and the cyclotrimerization of multifunctional cyanate esters to crosslinked polytriazine resins.

Particularly useful multifunctional alcohol, isocyanate, and epoxide components that can be cured by acid-catalyzed step-growth polymerization using catalysts of the present invention are described in U.S. Pat. Nos. 4,985,340, 4,503,211 and 4,340,716, and such description is incorporated herein by reference.

Suitable multifunctional cyanate esters that can be cured by catalyzed cyclotrimerization, using catalysts of this invention are described in U.S. Pat. Nos. 5,143,785 and 5,215,860 and such description is incorporated herein by reference.

Suitable multireactive monomers that can be cured by catalysts of the invention include glycidyl (meth)acrylate, hydroxy(alkyl) (meth)acrylates such as hydroxyethyl acrylate, isocyanatoethyl methacrylate, and the like.

When mixtures of more than one polymerizable monomer are used, the polymerizable components can be present in any proportion preferably with the minor component comprising at least 1.0 wt %.

Mixtures of aforementioned classes of monomers with additives such as tackifiers, hardeners, co-curatives, curing agents, stabilizers, sensitizers etc. can also be used in the polymerizable compositions of this invention. Furthermore, adjuvants, such as pigments, abrasive granules, stabilizers, light stabilizers, antioxidants, flow agents, bodying agents, flatting agents, colorants, inert fillers, binders, blowing agents, fungicides, bacteriocides, surfactants, plasticizers, and other additives as known to those skilled in the art can be added to the compositions of this invention. These can be added in an amount effective for their intended purpose, as long as they do not interfere with the polymerization of the compositions of the invention. Additionally, in compositions containing radiation-sensitive catalysts or initiators it is preferable that the adjuvants do not absorb radiation to which the catalysts or initiators are responsive.

Stabilizing additives useful in the compositions are described in detail in U.S. Pat. No. 5,554,664 (Lamanna et al.), and are incorporated herein by reference.

Solvents, preferably organic, can be used to assist in dissolving the curing agent in the polymerizable monomers described supra and as a processing aid. Representative solvents include acetone, methyl ethyl ketone, cyclopentanone, methyl cellosolve acetate, methylene chloride, nitromethane, methyl formate, acetonitrile, gamma-butyrolactone, 1,2-dimethoxyethane (glyme), 3-methyl sulfolane, and propylene carbonate. In some applications it may be advantageous to adsorb the curing agents onto an inert support such as silica, alumina, clays, etc., as described in U.S. Pat. No. 4,677,137.

In general, energy-induced polymerization of the polymerizable compositions of this invention, which incorporate a latent, light or radiation sensitive catalyst or initiator, (i.e. PAG) may be carried out at room temperature for the majority of energy curable compositions, although low temperature (e.g., −10° C.) or elevated temperature (e.g., 30° to 400° C., preferably 50° to 300° C.) can be used to subdue the exotherm of polymerization or to accelerate the polymerization, respectively. Temperature of polymerization and amount of catalyst will vary and be dependent on the particular curable composition used and the desired application of the polymerized or cured product. The amount of curing agent (ionic PAG) to be used in this invention should be sufficient to effect polymerization of the monomers (i.e., a catalytically effective amount) under the desired use conditions. Such amount generally will be in the range of about 0.01 to 20 wt %, and preferably 0.1 to 10 wt %, based on the weight of the curable composition. For purposes of this calculation, "curable composition" means the composition including all monomers, activators/initiators, additives, adjuvants, sensitizers and other non-solvent components of the polymerization mixture.

To activate radiation sensitive compositions of the present invention, any source of radiation including accelerated particles (e.g., electron beam or ion beam radiation), x-ray, extreme-UV, deep-UV, mid-UV near-UV and visible radiation can be used. Suitable sources of radiation include fluorescent lamps, mercury vapor discharge lamps, carbon arcs, tungsten lamps, xenon lamps, various lasers and laser sources, e-beam sources, ion beam sources, sunlight, etc. The required amount of exposure to activate the PAG and drive the chemical amplification process is dependent upon such factors as the identity and concentrations of the ionic PAG, the particular monomers or functional polymers present, the temperature and thickness of the exposed material, the type of substrate, the intensity of the radiation source and the amount of heat associated with the radiation.

It has been noted that photoacid generators of the present invention can provide exceptionally strong catalytic activity when activated as compared to other commonly known catalyst and photocatalyst systems. This is particularly true where monomers polymerizable by cationic addition polymerization or acid-catalyzed step-growth polymerization are used and in high activation energy photoresists which require strong acid photocatalysts.

The objects, features and advantages of the present invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLES

Glossary

| Descriptor | Description/Formula/Structure | Availability |
|---|---|---|
| Adogen | ADOGEN ™ 464; methyl trialkylammonium chloride | Sigma-Aldrich, Milwaukee, WI |
| 1,4-butane sultone | 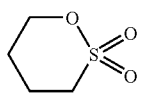 | Sigma-Aldrich |
| CHVE |  cyclohexanedimethanol divinyl ether | Sigma-Aldrich |
| diallyl amine | $HN(CH_2CH=CH_2)_2$ | Sigma-Aldrich |
| diethyl sulfate | $(C_2H_5O)_2SO_2$ | Sigma-Aldrich |
| diglyme | $(CH_3OCH_2CH_2)_2O$; Anhydrous (99.5%) | Sigma-Aldrich |
| dimethyl sulfate | $(CH_3O)_2SO_2$ | Sigma-Aldrich |
| 1,3-hexafluoropropylene disulfonic anhydride | 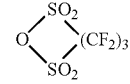 | Prepared according to U.S. Pat. No. 4,329,478 (Ex 1) |
| DTBPI-ONf | $[(CH_3)_3C\text{-}C_6H_4]_2\text{-}I^+ \quad C_4F_9SO_3^-$ | Daychem, Dayton, OH |
| DTBPI-PFOS | $[(CH_3)_3C\text{-}C_6H_4]_2\text{-}I^+ \quad C_8F_{17}SO_3^-$ | Daychem |
| DTBPI-OAc | $[(CH_3)_3C\text{-}C_6H_4]_2\text{-}I^+ \quad CH_3CO_2^-$ high purity sample | Daychem |
| EPON ™ 828 | 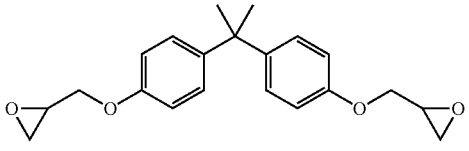 Bisphenol A diglycidyl ether | Shell Chemical, |
| ERL-4221 | 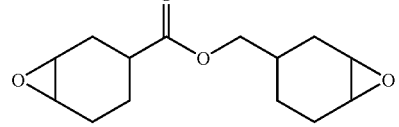 | Union Carbide, Danbury, CT |
| $FSO_2(CF_2)_3COF$ | 4-(fluorosulfonyl)hexafluorobutyryl fluoride | Can be prepared as described in U.S. Pat. No. 2,732,398 |
| $(C_6H_5)_3S^+\ ^-Br$ | Triphenylsulfonium bromide; high purity sample | Daychem |
| ITX | isopropyl thioxanthone | Sigma-Aldrich |
| KF | Potassium fluoride; spray dried (99%) | Sigma-Aldrich |
| PGMEA | DOWANOL ™ PMA; propylene glycol methyl ether acetate; $CH_3CO_2CH(CH_3)CH_2OCH_3$ | Dow Chemical, Midland, MI |
| tributyl amine | $(C_4H_9)_3N$ | Sigma-Aldrich |
| VEX 5015 | Vinyl ether | Allied Signal |

Analysis Methods

NMR $^1$H and $^{19}$F NMR spectra were acquired using a Varian UNITY plus 400 FT-NMR spectrometer operating at 400 MHz for $^1$H and 376 MHz for $^{19}$F. Either p-bis(trifluoromethyl)benzene or 2,2,2-trifluoroethanol were used as cross integration standards in the quantitative NMR analysis of PAG samples.

Thermal Gravimetric Analysis (TGA)

TGA was performed on a Perkin-Elmer Instruments TGA Model 7 in an open platinum pan. The onset of thermal decomposition, $T_d$, was taken as the thermal decomposition temperature of the photoacid generators and was determined under nitrogen atmosphere using a temperature ramp of 10° C. per minute. The onset temperature was determined by the intersection of tangents to the low temperature portion of the baseline and the first inflection point in the wt % vs. temperature curve.

Differential Scanning Calorimetry (DSC)

DSC was performed on a Perkin-Elmer Instruments DSC Model 7 using standard crimped aluminum pans on neat samples. Melting points, $T_m$, of the photoacid generators were determined by DSC under a nitrogen atmosphere using a temperature ramp of 20° C. per minute. The peak maximum of the melting endotherm was taken to be the melting point.

Photo-DSC/DSC: Standard (hermetic) liquid sample pans were used. Sample size was kept in the 6 to 8 mg range. Samples were tested using a Dupont Photo-DSC/DSC instrument (available from DuPont, Wilmington, Del.). The light source was a 200 W Hg lamp that delivered about 60 mw/cm$^2$ at the sample. Samples were exposed in open pans for 5 minutes to the light source at 30° C. then removed from the instrument, sealed and a standard DSC scan run at 10° C./minute to 300° C. A separate DSC experiment was carried out using a sealed sample pan and no prior light exposure to determine the dark reactivity of these PAGs. Comparison of the DSC traces before and after light exposure enables differentiation between the thermal reactivity of the PAGs (in the dark) and their photochemical activity.

Preparation of $FSO_2(CF_2)_4OCF(CF_3)COF$ 1,4-Butane sultone (6900 g, 50.7 mole) was electrochemically fluorinated in HF as described in U.S. Pat. No. 2,732,398 to give 4-(fluorosulfonyl)hexafluorobutyryl fluoride, $FSO_2(CF_2)_3COF$ (4000 g, 14.3 mole for a 28% yield). The coupling reaction reacted 4-(fluorosulfonyl)hexafluorobutyryl fluoride, $FSO_2(CF_2)_3COF$ (2162 g, 7.7 mole) with hexafluoropropylene oxide (1281 g, 7.7 mole) in 2 L diglyme with 114 g potassium fluoride to give perfluoro-4-(fluorosulfonyl)butoxypropionyl fluoride (2250 g, 5.1 mole; 65% yield) with 675 g of a higher boiling material having an additional hexafluoropropylene oxide unit. The desired perfluoro-4-(fluorosulfonyl)butoxypropionyl fluoride was separated and isolated by distillation (distillation range= 138–142° C.).

Preparation of Precursor 1: $LiO_3S(CF_2)_4OCF(CF_3)CF_2OCH_3$

A 500 mL, 3-necked round bottom flask was charged with KF (9.77 g, 0.168 mole), diglyme (150 mL), Adogen 464 (5.9 g; 56% in diglyme) and $FSO_2(CF_2)_4OCF(CF_3)COF$ (50 g, 92.6% purity by glc). Dimethyl sulfate (21.2 g, 0.168 mole) was then added all at once and the reaction mixture stirred under a nitrogen atmosphere and heated at 32° C. for about 18 hours. At the end of this time deionized water (~200 g) was added slowly and the mixture stirred for one hour at ambient temperature. The lower fluorochemical phase (45 g) was then separated, washed with brine and dried over magnesium sulfate. The mixture was distilled to yield $FSO_2(CF_2)_4OCF(CF_3)CF_2OCH_3$ (173–177° C., 94% purity). IR and gc/ms analyses were consistent with the structure.

A 250 mL round bottom flask was charged with $FSO_2(CF_2)_4OCF(CF_3)CF_2OCH_3$ (23.3 g, 0.048 mole) deionized water (150 g) and lithium hydroxide monohydrate (4.08 g, 0.097 mole). The resulting mixture was heated at 75° C. for about 18 hours, filtered and the aqueous solution treated with 48% aqueous HF until slightly acidic to pH paper. Water was removed using a rotary evaporator. The solid residue was treated with ethyl alcohol (about 200 mL; contained ~5% isopropyl alcohol) and this mixture heated to reflux for two hours. The alcohol solution was filtered and the solvent removed by using a rotary evaporator to yield $LiO_3S(CF_2)_4OCF(CF_3)CF_2OCH_3$.

Preparation of Precursor 2: $LiO_3S(CF_2)_4OCH_3$

In a procedure similar to that described for Preparation of Precursor 1, $FSO_2(CF_2)_3COF$ (70 g, 0.25 mole), KF (21.8 g, 0.37 mole), diglyme (350 ml), Adogen 464 (10 g of a 56% solution in anhydrous diglyme) and dimethyl sulfate (39.3 g, 0.312 mole) were combined and reacted at 32° C. for 18 hours. Deionized water (~250 g) was carefully added and the reaction mixture stirred at about 50° C. for two hours. This was followed by heating the solution to about 105° C. and steam distilling the product into a Dean Stark trap in which the lower fluorochemical phase was separated from the upper aqueous phase. The mixture was distilled (134–135° C.) to yield $FSO_2(CF_2)_4OCH_3$ (57.4 g,). The product structure, which included three branched chain isomers, was confirmed by gc/ms, $^1$H $^{19}$F NMR.

$FSO_2(CF_2)_4OCH_3$ (35.8 g, 0.114 mole) was treated with lithium hydroxide monohydrate (12 g, 0.285 mole) in deionized water (150 g) at 75° C. for six hours. After cooling to room temperature, two small pieces of solid carbon dioxide (Dry Ice) were added to neutralize the excess lithium hydroxide. The water was removed by using a rotary evaporator and the residue extracted with alcohol as described in Preparation of Precursor 1 above to yield $LiO_3S(CF_2)_4OCH_3$.

Preparation of Precursor 3: $LiO_3S(CF_2)_4OC_2H_5$

In a procedure similar to that described in Preparation of Precursor 1, $FSO_2(CF_2)_3COF$ (70 g, 0.25 mole), KF (21.8 g, 0.37 mole), diglyme (350 ml), Adogen 464 (10.5 g of a 56% solution in anhydrous diglyme) and diethyl sulfate (48 g, 0.312 mole) were combined and reacted at 52° C. for 16 hours. Deionized water (~250 g) was carefully added and the reaction mixture allowed to stir at about 65° C. for two hours. This was followed by heating the solution to about 105° C. and steam distilling the product into a Dean Stark trap after which the lower fluorochemical-containing phase was separated from the upper aqueous phase. The lower fluorochemical-containing phase mixture was distilled 51.3 g (147° C.) to yield $FSO_2(CF_2)_4OC_2H_5$ (51.3 g); The product structure, which included three branched chain isomers, was confirmed by gc/ms, $^1$H and $^{19}$F NMR. $FSO_2(CF_2)_4OC_2H_5$ (30.8 g, 0.094 mole) was treated with excess lithium hydroxide as described in Preparation 3 and converted to $LiO_3S(CF_2)_4OC_2H_5$ (30.2 g). The product structure was confirmed by lc/ms and $^1$H and $^{19}$F NMR. A small impurity of $CF_3CFHOC4F_8SO_3Li$ was observed in the liquid chromatography/mass spectrometry (lc/ms).

Preparation of Precursor 4: $LiO_3S(CF_2)_4OCH_2C_6H_5$

In a procedure similar to that described for Preparation of Precursor 1, $FSO_2(CF_2)_3COF$ (50 g, 0.18 mole), KF (11.4 g, 0.12 mole), diglyme (300 mL), methyltributylammonium methyl sulfate (6 g of a 48% solution in anhydrous diglyme), and benzyl bromide (30.6 g, 0.18 mole) were combined and reacted at 52° C. for 5 hours and then held at 60° C. for eighteen hours. About 200 g of water was added and the product steam distilled as previously described. The lower fluorochemical phase (21.1 g) was distilled under vacuum and the distillation cut (9.3 g) at 78–79° C./3 mm Hg (400 Pa) found to contain two main isomers of $FSO_2(CF_2)_4OCH_2C_6H_5$ by glc of 5.1% and 93.2% respectively as confirmed by gc/ms.

$FSO_2(CF_2)_4OCH_2C_6H_5$ was treated with excess aqueous lithium hydroxide as described in Preparation of Precursor 3 except that the solution was heated at 75° C. for eighteen hours. After neutralization of the excess hydroxide with solid carbon dioxide, it was noted that a lower fluorochemical-containing phase was still present. Additional lithium hydroxide was added as well as about 50 mL of methanol and the reaction mixture heated to 84° C. for an additional eighteen hours. This solution was then neutralized in the usual manner and $LiO_3S(CF_2)_4OCH_2C_6H_5$ was isolated after alcohol extraction (9.4 g).

Preparation of Precursor 5: $Li^{+-}O_3S(CF_2)_3SO_2N(CH_2CH=CH_2)_2$

Under a nitrogen atmosphere, 1,3-hexafluoropropylene-disulfonic anhydride (7.1 g, 0.024 mole) and methylene chloride (5 mL) were charged to a dry Schlenck tube equipped with a magnetic stir bar and a rubber septum. The resulting solution was cooled to 0° C. in an ice bath followed by dropwise addition of anhydrous diallylamine (5.78 g, 0.059 mole) with stirring. After 30 minutes, the reaction solution was allowed to warm to room temperature. A lower liquid phase was separated and discarded.

The remaining methylene chloride solution was evaporated to dryness at 64° C. under vacuum to remove all volatiles. The light brown crystalline residue that remained was dissolved in a solution of 3.0 g lithium hydroxide hydrate in deionized water (300 mL). This solution was distilled through a Vigreux column equipped with a Dean Stark trap. A low boiling, low-density phase distilled first (diallylamine), followed by water. A total of 100 mL of distillated was collected and reserved. The aqueous product solution remaining in the still pot was allowed to cool to room temperature and then treated with dry ice to convert all residual LiOH to $Li_2CO_3$, resulting in a final pH of 7.0.

The aqueous mixture was treated with Celite™ (available from Sigma-Aldrich) and filtered by suction through a glass frit to yield a light yellow filtrate. The aqueous filtrate was evaporated to dryness using a rotary evaporator, yielding a white solid residue. The solid was dissolved in 200 mL of acetonitrile and filtered by suction through a 0.2 micron Tefsep™ membrane. The filtrate was again evaporated to dryness at 70° C., 20 Torr (2.7 kPa) to yield 5.76 g of white solid, corresponding to 60% yield of the desired product. After grinding, the solid was further dried in a vacuum oven at 105° C., 10.0 mTorr (1.3 Pa) for 3 hours to remove trace amounts of water and organic volatiles. Quantitative analysis by $^1H$ and $^{19}F$ NMR indicated that the sample was greater than 97 mole % desired product (isomers included).

Preparation of Precursor 6. $Li^{+-}O_3S(CF_2)_4OCH_2CH_2CH_3$

In a procedure similar to that described for Preparation of Precursor 2, $FSO_2(CF_2)_3COF$ (60 g of 82% purity, 0.18 mole), KF (13.7 g, 0.23 mole), diglyme (250 ml), Adogen 464 (13.4 g of a 56% solution in anhydrous diglyme) and dipropyl sulfate (TCI America) (38.9 g, 0.21 mole) were combined and reacted at 52° C. for 5 hours and then held at 60° C. for eighteen hours. 200 g of deionized water was carefully added and the product steam distilled as previously described. The lower fluorochemical phase was distilled through the concentric tube column and the distillation cut at 163–164° C. (24.3 g) obtained as a mixture of several isomers, which were used without further purification in the next step.

$FSO_2(CF_2)_4OCH_2CH_2CH_3$ (24.3 g, 0.071 mole) was treated with lithium hydroxide monohydrate (11.9 g, 0.28 mole) in 150 g water at 75° C. for six hours. After cooling to room temperature the solution was neutralized with solid carbon dioxide. The water was removed by rotary evaporation and the residue extracted with alcohol as described above to afford 22.5 g of the white lithium salt. Quantitative analysis by $^1H$ and $^{19}F$ NMR indicated that the sample was greater than 97 mole % desired product.

Preparation of PAG1: $(p-(CH_3)_3C-C_6H_4)_2I^{+-}O_3S(CF_2)_4OC_2H_5$

A 1.0 L Erlenmeyer flask was charged with an aqueous solution of $LiO_3S(CF_2)_4OC_2H_5$ (Precursor 3; 18.713 g, 0.029 mole, 51%), DTBPI-OAc (12.38 g, 0.027 mole), deionized water (200 mL) and methylene chloride/methyl-t-butyl ether (200 mL, 50:50 mixture by volume). The contents were stirred at room temperature for at least one hour and then transferred to a 1.0 L separatory funnel and shaken vigorously. After allowing the mixture to phase separate, the organic phase containing the dissolved product was isolated and then washed with four fresh 200 mL portions of deionized water. Once washing was complete, the organic phase was dried by stirring over high purity silica gel (5 g) for an hour. The dried solution was filtered by suction through a 0.2 micron Tefsep™ filter to remove silica gel. The pad of silica gel was washed with two additional 70 mL portions of the methylene chloride/methyl-t-butyl ether mixture and the combined filtrate was evaporated to dryness on a rotary evaporator at 50° C. and approximately 20 Torr (2.7 kPa).

The remaining product residue was dissolved in 30 mL of ethyl acetate and subsequently precipitated by gradual addition of 210 mL of hexanes with stirring. The white crystalline precipitate was filtered by suction, washed with two portions of a 7:1 hexanes:ethyl acetate mixture and dried partially by suction. Residual solvent was removed by vacuum drying at 60° C. overnight at 10 mTorr (1.3 Pa). After vacuum drying, 15.978 g of $(p-(CH_3)_3C-C_6H_4)_2I^{+-}O_3S(CF_2)_4OC_2H_5$ was isolated as a white crystalline powder (15.978 g, a yield of 81.2%). Quantitative $^1H$ and $^{19}F$ NMR spectroscopy in methanol-$d_4$ indicated the product was greater than 99% pure. The anion contained 88% linear $(-CF_2-)_4$ groups, the remainder of the $-(C_4F_8)-$ perfluorobutylene groups were mixtures of branched isomers. The melting point determined by differential scanning calorimetry (DSC) was 136° C. and the onset of thermal decomposition determined under nitrogen by thermogravimetric analysis (TGA) was 229° C.

Preparation of PAG2: $(p-(CH_3)_3C-C_6H_4)_2I^{+-}O_3S(CF_2)_4OCH_3$

PAG2 was prepared according to the procedure described in Preparation of PAG1 with the exception that an aqueous solution of $LiO_3S(CF_2)_4OCH_3$ (Precursor 2, 20.0 g, 0.03 mole, 50%) was used in place of Precursor 3, and DTBPI-OAc (13.5 g, 0.03 mole) was used. After vacuum drying, $(p-(CH_3)_3C-C_6H_4)_2I^{+-}O_3S(CF_2)_4OCH_3$ (12.9 g; 61.5% yield) was isolated as a white solid powder. Quantitative $^1$H and $^{19}$F NMR spectroscopy in methanol-$d_4$ indicated the product was greater than 99% pure. The anion contained 81% linear (—$CF_2$—)$_4$ groups, the remainder of the —($C_4F_8$)— perfluorobutylene groups were mixtures of branched isomers. The melting point determined by differential scanning calorimetry (DSC) was 189° C. and the onset of thermal decomposition determined under nitrogen by thermogravimetric analysis (TGA) was 223° C.

Preparation of PAG3: (p-$(CH_3)_3C$—$C_6H_4)_2I^{+-}O_3S(CF_2)_4OCF(CF_3)CF_2OCH_3$ PAG3 was prepared essentially according to the procedure described for PAG1 with the exception that an aqueous solution of $LiO_3S(CF_2)_4OCF(CF_3)CF_2OCH_3$ (Precursor 1, 23.0 g, 0.021 mole, 44.7%) was used in place of Precursor 3 and DTBPI-OAc (8.735 g, 0.019 mole) was used. After vacuum drying, (p-$(CH_3)_3C$—$C_6H_4)_2I^{+-}O_3S(CF_2)_4OCF(CF_3)CF_2OCH_3$ (10.13 g; 60.2% yield) was isolated as a white solid powder. The major signals in the $^1$H and $^{19}$F NMR spectra recorded in methanol-$d_4$ were consistent with the desired product; however, a quantitative assessment of product purity was not possible due to the complexity of the $^{19}$F NMR signals arising from the minor, multiply branched anion isomers. The melting point determined by differential scanning calorimetry (DSC) was 118° C. and the onset of thermal decomposition determined under nitrogen by thermogravimetric analysis (TGA) was 234° C.

Preparation of PAG4: $(C_6H_5)_3S^{+-}O_3S(CF_2)_4OCF(CF_3)CF_2OCH_3$

A 1.0 L Erlenmeyer flask was charged with an aqueous solution of $LiO_3S(CF_2)_4OCF(CF_3)CF_2OCH_3$ (Precursor 1, 23.0 g, 0.021 mole, 44.7%) and $(C_6H_5)_3S^{+-}Br$ (6.63 g, 0.019 mole) along with deionized water (150 mL) and methylene chloride (250 mL). The contents were stirred magnetically at room temperature for at least one hour and then transferred to a 1.0 L separatory funnel and shaken vigorously. After allowing the mixture to phase separate, the lower organic phase containing the dissolved PAG4 was isolated, then washed with four portions of deionized water (150 mL each). Once washing was complete, the organic phase was dried by stirring over high-purity silica gel (4 g) for an hour. The dried solution was filtered by suction through a 0.2 micron Tefsep™ filter to remove silica gel. The pad of silica gel was washed with two additional portions of the methylene chloride (50 mL each) and the combined filtrate was evaporated to dryness using a rotary evaporator at 50° C. and approximately 20 Torr (2.7 kPa).

The remaining product residue was dissolved in ethyl acetate (25 mL) and subsequently precipitated as a lower oil phase by gradual addition of hexanes (300 mL) with stirring. The upper organic solvent phase was decanted and the remaining product oil was washed with two portions of hexane (200 mL each). The liquid product was dried in a vacuum oven at 70° C. overnight at 10 mTorr (1.3 Pa). After vacuum drying, $(C_6H_5)_3S^{+-}O_3S(CF_2)_4OCF(CF_3)CF_2OCH_3$ (11.8 g, 82.5% yield) was isolated as a clear colorless viscous oil. After storage for one week at room temperature the product crystallized to a hard, wax-like solid. The major signals in the $^1$H and $^{19}$F NMR spectra recorded in methanol-$d_4$ were consistent with the desired product; however, a quantitative assessment of product purity was not possible due to the complexity of the $^{19}$F NMR signals arising from the minor, multiply branched anion isomers.

Preparation of PAG5: (p-$(CH_3)_3C$—$C_6H_4)_2I^{+-}O_3S(CF_2)_3SO_2N(CH_2CH=CH_2)_2$ PAG5 was prepared essentially according to the procedure described for the Preparation of PAG1 with the exception that $LiO_3S(CF_2)_3SO_2N(CH_2CH=CH_2)_2$ (Precursor 5, 2.5 g, 0.007 mole) was used in place of Precursor 3 and DTBPI-OAc (2.59 g, 0.006 mole) was used. After vacuum drying, (p-$(CH_3)_3C$—$C_6H_4)_2I^{+-}O_3S(CF_2)_3SO_2N(CH_2CH=CH_2)_2$ (3.56 g, 79.3% yield) was isolated as a white powder. Quantitative $^1$H and $^{19}$F NMR spectroscopy in methanol-$d_4$ indicated the product was of high purity, the major impurities being an isomer at the 1.3 mole % level in which the double bond of the allyl group has been isomerized to the internal position (N—CH=CH—$CH_3$) and a difunctional anion, $(^-O_3SCF_2CF_2CF_2SO_2)_2$ $NCH_2CH=CH_2$, present at the 0.54 mole % level. The anion contained greater than 99% linear (—$CF_2$—)$_3$ groups. The melting point determined by differential scanning calorimetry (DSC) was 112° C. and the onset of thermal decomposition determined under nitrogen by thermogravimetric analysis (TGA) was 233° C.

Preparation of PAG6: $(C_6H_5)_3S^{+-}O_3S(CF_2)_4OCH_2CH_2CH_3$

PAG6 was prepared essentially according to the procedure described for PAG4, with the exception that $Li+-O_3S(CF_2)_4OC_3H_7$ (Precursor 6, 8.86 g, 0.026 mole) was used in place of Precursor 1 and reacted with $(C_6H_5)_3S^{+-}Br$ (8.0 g, 0.023 mole).

Epoxy and Vinyl Ether Curing Experiments (1) Comparative Vinyl Ether Cure Speeds of PAGs This example describes vinyl ether curing experiments to determine qualitatively the relative photo-reactivity of a PAG of the present invention containing a segmented hydrocarbon-fluorocarbon-sulfonate anion compared to a related PAG having an identical cation and a perfluorobutane-sulfonate anion. Relative reactivities toward vinyl ether polymerization were measured by recording the time required to cure a liquid monomer solution to a crosslinked infusible solid using cyclohexanedimethanol divinyl ether (CHVE, obtained from Aldrich) as the vinyl ether monomer.

Procedure: The following two mixtures (A and B), were prepared in separate, clear glass vials:

TABLE 1

| Mixture A | |
| --- | --- |
| Ingredient | Weight (g) |
| DTBPI-ONf (C1) | 0.061 |
| CHVE | 2.8 |
| PGMEA | 0.13 |

TABLE 2

| Mixture B | |
| --- | --- |
| Ingredient | Weight (g) |
| DTBPI-OSO$_2$(CF$_2$)$_4$OCH$_3$ (PAG2) | 0.082 |
| CHVE | 4.1 |
| PGMEA | 0.21 |

The mixtures were shaken vigorously at room temperature; however, in both cases dissolution of the PAGs was incomplete. The heterogeneous liquid mixtures were poured into aluminum weighing pans and then irradiated at room temperature in air with a dual fluorescent germicidal lamp equipped with two Philips TUV 15 W/G 15 T8 UV-C bulbs with primary output at 254 nm and providing an exposure dose of approximately 1.0 mJ/sec/cm². Both samples were observed to cure instantly (<1 second) upon irradiation, forming a thick, brittle solid polymeric crust on the surface of the underlying liquid monomer. After a period of seconds under sustained irradiation both samples showed evidence of localized charring from the intense heat of polymerization. Upon physical disruption of the hard, polymerized crust to expose underlying liquid vinyl ether monomer to the incident light, immediate additional photocuring occurred, suggesting that penetration of the 254 nm light through the depth of the mixture is limited. The photoreactivities of the two PAGs, one containing a perfluoroalkanesulfonate anion (A) and the other containing a segmented anion of the invention (B), were visibly indistinguishable and very high in both cases. The results indicate that both PAGs are capable of generating photoacids of very high acid strength (i.e., superacids) adequate for initiating very rapid vinyl ether polymerization.

(2) Comparative Cationic Curing Activities of PAGs Determined by Photo-DSC/DSC:

This example describes photo-DSC/DSC experiments designed to quantitatively compare the relative cationic curing reactivities of PAGs of the present invention containing segmented anions with related PAGs having identical cations and perfluoroalkanesulfonate anions. Relative reactivities were measured in three different cationically polymerizable monomer systems, including two different types of epoxies and one vinyl ether.

The photo-DSC experiment provides information on the photo-cure speed at 30° C. as measured by the induction time (onset) and time to reach the peak maximum in the curing exotherm. Shorter induction and peak maximum times indicate faster photo-cure speeds and a more active PAG. The energy released under the curing exotherm is a measure of the extent of cure; larger values mean more cure has taken place during the light exposure. The DSC scan provides information about rate and degree of cure after light exposure from the energy (larger values means more cure) and the onset and peak temperature (lower temperatures indicate a faster cure rate and a more active initiator). Comparison with the DSC traces recorded with no prior light exposure provides a measure of the increase in activity after photoactivation of the PAG.

General: Stock solutions of three cationically curable monomers were prepared as shown in Table 3 with 0.1% (w/w) isopropylthioxanthone (ITX). Epon 828 is a difunctional glycidyl ether epoxy from Shell, ERL-4221 is a difunctional cycloaliphatic epoxy from Union Carbide and VEX 5015 is a trifunctional vinyl ether from Allied Signal. Because of the low sensitivity of these compositions to room lights, all sample preparation was done with the lab lights on but the hood lights off. All PAGs were formulated at 1.0% by weight in the stock monomer/sensitizer solutions. Into a small aluminum pan was weighed 0.02 g of PAG and 0.04 g of propylene carbonate used to promote dissolution of the PAG in the monomer. The pan was heated briefly on a hot plate set at 100° C. to dissolve the PAG, then 2.0 g the stock monomer/sensitizer solution was added. The solution was briefly heated again on a hot plate set at 100° C. to allow complete mixing of the components, then the solution was allowed to cool to room temperature before using.

TABLE 3

Stock Solutions

| Stock Solution | Monomer |
| --- | --- |
| 1 | Epon ™ 828 |
| 2 | ERL-4221 |
| 3 | VEX-5015 |

Below are tabulated results (Tables 4,5 & 6) for the three reactive monomer systems:

TABLE 4

Photoacid Generators Tested in Epon ™ 828

| | | PDSC | | | DSC after PDSC | | | DSC Only (dark) | | |
| --- | --- | --- | --- | --- | --- | --- | --- | --- | --- | --- |
| Ex | PAG | Energy (J/g) | Peak Max | Induction Time | Onset Temp (° C.) | Peak Max | Energy (J/g) | Onset Temp (° C.) | Peak Max | Energy (J/g) |
| C1 | DTBPI-ONf | 10 | 21.2 | 12.5 | 100 | 190 | 558 | 175 | 232 | 606 |
| C2 | DTBPI-PFOS | 4 | 28.4 | 18.9 | 100 | 197 | 566 | 175 | 238 | 608 |
| 1 | PAG1 | 6 | 26.6 | 17 | 120 | 210 | 589 | 175 | 241 | 573 |
| 2 | PAG2 | 9 | 24.6 | 16 | 120 | 208 | 578 | 175 | 242 | 613 |
| 3 | PAG3 | 5 | 28 | 17.9 | 125 | 206 | 555 | 180 | 239 | 598 |

TABLE 5

Photoacid Generators Tested in ERL-4221

| | | PDSC | | | DSC after PDSC | | | DSC Only (dark) | | |
| --- | --- | --- | --- | --- | --- | --- | --- | --- | --- | --- |
| Ex | PAG | Energy (J/g) | Peak Max | Induction Time | Onset Temp (° C.) | Peak Max | Energy (J/g) | Onset Temp (° C.) | Peak Max | Energy (J/g) |
| C3 | DTBPI-ONf | 5 | 24 | 15.7 | 50 | 148 | 577 | 150 | 192 | 566 |

TABLE 5-continued

Photoacid Generators Tested in ERL-4221

| | | PDSC | | DSC after PDSC | | | DSC Only (dark) | | |
|---|---|---|---|---|---|---|---|---|---|
| Ex | PAG | Energy (J/g) | Peak Max | Induction Time | Onset Temp (° C.) | Peak Max | Energy (J/g) | Onset Temp (° C.) | Peak Max | Energy (J/g) |
| C4 | DTBPI-PFOS | 4 | 22.4 | 14.8 | 65 | 155 | 560 | 150 | 190 | 583 |
| 4 | PAG1 | 7 | 23.4 | 14.3 | 60 | 164 | 610 | 150 | 194 | 570 |
| 5 | PAG2 | 8 | 21.8 | 13 | 75 | 162 | 596 | 150 | 195 | 585 |
| 6 | PAG3 | 6 | 20.8 | 13.2 | 60 | 154 | 570 | 150 | 192 | 574 |

TABLE 6

Photoacid Generators Tested in VEX 5015

| | | PDSC | | DSC after PDSC | | | DSC Only (dark) | | |
|---|---|---|---|---|---|---|---|---|---|
| Ex | PAG | Energy (J/g) | Peak Max | Induction Time | Onset Temp (° C.) | Peak Max | Energy (J/g) | Onset Temp (° C.) | Peak Max | Energy (J/g) |
| C5 | DTBPI-ONf | 242 | 2.8 | 0.9 | 125 | 159 | 31 | 100, 155 | 116, 173 | 305, 44 |
| C6 | DTBPI-PFOS | 230 | 3.2 | 1.1 | 140 | 163 | 24 | 100, 160 | 116, 175 | 305, 33 |
| 7 | PAG1 | 242 | 3.2 | 1.1 | 125 | 156 | 56 | 100, 160 | 120, 171 | 306, 60 |
| 8 | PAG2 | 242 | 3.8 | 1.5 | 125 | 156 | 49 | 100, 160 | 120, 170 | 301, 60 |
| 9 | PAG3 | 221 | 3.2 | 1.3 | 135 | 158 | 33 | 100, 160 | 112, 172 | 290, 42 |

Comparing the DSC traces recorded without light exposure (DSC Only) to the DSC traces recorded after the PDSC scans indicates that all of the irradiated samples show a shift to lower cure temperature as indicated from the onset and peak position of the curing exotherm. This indicates that all the PAG samples have undergone photogeneration of an active catalyst or initiator upon light exposure. With the highly reactive vinyl ether monomer, most of the curing occurs during the PDSC experiment at 30° C. In the case of the two less reactive epoxy monomers, curing during the PDSC experiment is minimal and most of the curing occurs during the subsequent temperature ramp applied during the DSC experiment. In all cases the reactivity of the PAGs of the present invention (PAG1, PAG2 and PAG3) toward the various monomers is similar to the comparative PAGs containing perfluoroalkanesulfonate anions (DTBPI-ONf, and DTBPI-PFOS). Thus, in cationically polymerizable monomer systems such as these, there does not appear to be a significant difference in the reactivity of photoacids produced from segmented hydrocarbon-fluorocarbon-sulfonate anions of the present invention and those generated from perfluoroalkanesulfonate anions.

The invention claimed is:

1. An ionic photoacid generator comprising:
   (a) a cation comprising at least one of
      i. a transition metal containing organometallic cation,
      ii. an organic onium cation, or
      iii. a mixture thereof, and
   (b) an anion of the formula

   $^-O_3S$—$R_f$—O—$(R_h$—$Z_m)_n$ where:
   $R_f$ is a highly fluorinated divalent, branched alkylene having 3 to 12 catenary carbon atoms, or a highly fluorinated cyclic alkylene, or a highly fluorinated oxaalkylene moiety;
   $R_h$ is a hydrocarbon moiety;
   n is 1 to 2;
   m is independently 1 to 3; and
   Z is a pendant group selected from the group consisting of —Cl, —Br, —I, —NO$_2$, —SO$_3$', —H, —CN, —NCO, —OCN, —CO$_2^-$, —OH, —OR$_1$', —SR$_1$', —C(O)N(R$_1$')$_2$, —N(R$_1$')C(O)R$_1$', —N(R$_1$')SO$_2$R$_1$', —SO$_2$N(R$_1$')$_2$, —SO$_2$R$_1$', —SOR$_1$', —OC(O)R$_1$', —C(O)OR$_1$', —C(O)R$_1$', —Si(OR$_1$')$_3$, —Si(R$_1$')$_3$, and an epoxy group, where R$_1$' is independently H, an unbranched or branched, cyclic or acyclic, saturated or unsaturated alkyl group;
   wherein there are at least two fluorinated carbon atoms between said —O— group and said $^-O_3S$ group.

2. The anion of claim 1 wherein $R_h$ is a hydrocarbon moiety containing from about 1 to about 20 carbon atoms.

3. The anion of claim 1 wherein $R_f$ is a perfluoroalkylene or a perfluorooxaalkylene moiety.

4. The anion according to claim 1 wherein the Z group is a polymerizable group.

5. The anion according to claim 4 wherein the Z group is selected from the group consisting of —OC(O)C(CH$_3$)=CH$_2$, —OC(O)CH=CH$_2$, —NHC(O)CH=CH$_2$ and —NHC(O)C(CH$_3$)=CH$_2$.

6. The anion according to claim 1 wherein Z is —H.

7. The photoacid generator of claim 1 wherein the cation comprises an I-, P-, C-, Se-, N-, or S-centered organic onium cation.

8. The photoacid generator of claim 1 wherein the cation comprises an I- or S-centered organic onium cation.

9. The photoacid generator of claim 1 wherein $R_h$ is an alkylene moiety.

10. The photoacid generator of claim 1 wherein $R_f$ is a perfluoroalkylene moiety.

11. The photoacid generator of claim 10 wherein said perfluoroalkylene moiety has 3 to 7 carbon atoms.

12. The photoacid generator of claim 1 wherein said anion is selected from the group consisting of:
$C_2H_5OCF_2CF(CF_3)SO_3^-$, $CH_3OCF_2CF(CF_3)O(CF_2)_4SO_3^-$, $C_2H_5OCF_2CF(CF_3)O(CF_2)_4SO_3^-$, $(CF_3)_2CFCF(OC_2H_5)CF_2CF_2CF_2SO_3^-$, and $(CF_3)_2CFCF(OCH_3)CF_2CF_2CF_2SO_3^-$.

13. The photoacid generator of claim 8 wherein said S-centered organic onium cation is a sulfoxonium or triarylsulfonium cation.

14. The photoacid generator of claim 8 wherein said organic onium cation is selected from the group consisting of diphenyliodonium, ditolyliodonium, didodecylphenyliodonium, (4-octyloxyphenyl)phenyliodonium, bis(methoxyphenyl)iodonium; triphenylsulfonium, diphenyl-4-thiophenoxyphenylsulfonium, 1,4-phenylene-bis(diphenylsulfonium), bis-(4-t-butylphenyl)-iodonium, (4-t-butyl-phenyl)-diphenyl-sulfonium, tris-(t-butyl-phenyl)-sulfonium, (4-butoxy-phenyl)-diphenylsulfonium, 1-(2-naphthalen-2-yl-2-oxo-ethyl)-tetrahydro-thiophenium, dimethyl-(2-oxo-cyclohexyl)-sulfonium, bicyclo[2.2.1]hept-2-yl-methyl-(2-oxo-cyclohexyl)-sulfonium, cyclohexyl-methyl-(2-oxo-cyclohexyl)-sulfonium, dimethyl-(2-oxo-2-phenyl-ethyl)-sulfonium, (4-hydroxy-3,5-dimethyl-phenyl)-dimethyl-sulfonium, and (4-isopropyl-phenyl)-p-tolyl-iodonium.

15. The photoacid generator of claim 1 wherein said transition metal containing organometallic cation is selected from the group consisting of bis($\eta^5$-cyclopentadienyl)iron (1+), bis($\eta^5$-methylcyclopentadienyl) iron (1+), ($\eta^5$-cyclopentadienyl)($\eta^5$-methylcyclopentadienyl) iron (1+), bis($\eta^5$-trimethylsilylcyclopentadienyl) iron (1+); bis($\eta^6$-xylenes) iron (2+), bis($\eta^6$-mesitylene) iron (2+), bis($\eta^6$-durene) iron (2+), bis($\eta^6$-pentamethylbenzene) iron (2+), and bis($\eta^6$-dodecylbenzene) iron (2+); ($\eta^5$-cyclopentadienyl)($\eta^6$-xylenes) iron(1+), ($\eta^5$-cyclopentadienyl)($\eta^6$-toluene) iron(1+), $\eta^5$-cyclopentadienyl)($\eta^6$-mesitylene) iron(1+), ($\eta^5$-cyclopentadienyl)($\eta^6$-pyrene) iron(1+), ($\eta^5$-cyclopentadienyl)($\eta^6$-naphthalene) iron(1+), and ($\eta^5$-cyclopentadienyl)($\eta^6$-dodecylphenyl) iron(1+).

16. A photoresist composition comprising:
a) the photoacid generator of claim 1, and
b) a resist polymer.

17. The photoresist composition of claim 16 wherein said resist polymer is selected from the group of polyphthaldehyde, polyacrylates, polymethacrylates, polystyrenes, polycycloolefins, polycycloolefin-maleic anhydride copolymers, copolymers of fluoroolefins with cycloolefins, and phenol-formaldehyde condensation polymers.

18. The photoresist composition of claim 16 wherein said resist polymer is a positive resist polymer.

19. The photoresist composition of claim 18 wherein said positive resist polymer contains acid labile functional groups, which cleave on exposure to acid.

20. The photoresist composition of claim 16 comprising 0.1 to 10 wt. % of said photoacid generator.

21. The photoresist composition of claim 16 comprising 1 to 5 wt. % of said photoacid generator.

22. The photoresist composition of claim 16 wherein said resist polymer is a negative resist polymer.

23. The photoresist composition of claim 18 wherein said positive resist polymer contains functional groups, which deprotect upon exposure to acid.

24. The photoresist composition of claim 23 wherein said functional groups of said positive resist polymer are selected from ester groups, carbonate groups, silyl ether groups, acetal and ketal groups, and ether groups.

25. The photoresist composition of claim 16 wherein the $R_h$ of said photoacid generator is an alkylene moiety.

26. A method of preparing a photoresist comprising the steps of:
a) coating a substrate with a mixture of a resist polymer and the photoacid generator of claim 1, and
b) selectively irradiating said coating to activate said photoacid generator.

27. The method of claim 26 wherein said coating is selectively irradiated by means of laser writing.

28. The method of claim 26 wherein said coating is selectively irradiated by means of a mask.

29. The method of claim 26 wherein said selective irradiation effects decomposition of said photoacid generator to produce acid.

30. The method of claim 26 wherein said mixture comprises 0.1 to 10 wt. % of said photoacid generator.

31. The method of claim 26 further comprising the step of heating said irradiated coating at elevated temperatures to effect differential solubility of said irradiated regions.

32. The method of claim 26 wherein said substrate is selected from silicon wafers, metal clad substrates and metal printing plates.

33. A curable composition comprising:
a) the ionic photoacid generator of claim 1; and
b) one or more monomers comprising at least one of a cationically polymerizable monomer, an ethylenically-unsaturated free radically polymerizable monomer, or multifunctional or multireactive monomers polymerizable by acid-catalyzed step-growth polymerization, or multifunctional or multireactive monomers polymerizable by any combination of these polymerization mechanisms, and mixtures thereof.

34. The curable composition of claim 33 wherein the ionic photoacid generator is a photosensitive salt in the concentration range from 0.1 to 10 wt. %.

* * * * *

UNITED STATES PATENT AND TRADEMARK OFFICE
CERTIFICATE OF CORRECTION

PATENT NO. : 7,078,444 B2
APPLICATION NO. : 11/029975
DATED : July 18, 2006
INVENTOR(S) : William M. Lamanna It is certified that error appears in the above-identified patent and that said Letters Patent is hereby corrected as shown below:

Col. 1
Lines 6–7, after "divisional of" delete "application Ser. No. 10/286,330 filed Nov. 1, 2002, now".

Col. 6
Line 22, delete "Rh," and insert -- $R_h$, --, therefor.

Col. 12
Line 20, after "iron (1+)," delete "(η5" and insert -- $(\eta^5$ --, therefor.
Line 28, after "pentadienyl)" delete "(η6" and insert -- $(\eta^6$ --, therefor.

Col. 24
Line 66, delete "$CF_3CFHOC4F_8SO_3Li$" and insert -- $CF_3CFHOC_4F_8SO_3Li$ --, therefor.

Col. 28
Line 24, delete "Li+–$O_3$S" and insert -- $Li^+\text{–}O_3S$ --, therefor.

Signed and Sealed this

Eighteenth Day of March, 2008

JON W. DUDAS
*Director of the United States Patent and Trademark Office*